US008000914B2

(12) United States Patent
Venkatasubramanian et al.

(10) Patent No.: US 8,000,914 B2
(45) Date of Patent: Aug. 16, 2011

(54) SYSTEMS AND METHODS FOR ELECTROMECHANICAL OSCILLATION MONITORING

(75) Inventors: Vaithianathan Venkatasubramanian, Pullman, WA (US); Guoping Liu, Chongqing (CN)

(73) Assignee: Washington State University, Pullman, WA (US)

( * ) Notice: Subject to any disclaimer, the term of this patent is extended or adjusted under 35 U.S.C. 154(b) by 184 days.

(21) Appl. No.: 12/397,207

(22) Filed: Mar. 3, 2009

(65) Prior Publication Data
US 2009/0222144 A1  Sep. 3, 2009

Related U.S. Application Data

(60) Provisional application No. 61/067,996, filed on Mar. 4, 2008.

(51) Int. Cl.
*G01R 13/08* (2006.01)
(52) U.S. Cl. ................. 702/60; 702/59; 702/69; 702/74
(58) Field of Classification Search .................... 702/58, 702/59, 60, 64, 65, 72, 75, 117, 179, 183, 702/189; 367/31; 375/343, 376
See application file for complete search history.

(56) References Cited

U.S. PATENT DOCUMENTS

| | | | | |
|---|---|---|---|---|
| 5,077,697 A | * | 12/1991 | Chang | 367/31 |
| 5,414,741 A | * | 5/1995 | Johnson | 375/376 |
| 7,065,162 B1 | * | 6/2006 | Sorrells et al. | 375/343 |

\* cited by examiner

*Primary Examiner* — Michael P Nghiem
*Assistant Examiner* — Felix E Suarez
(74) *Attorney, Agent, or Firm* — China Science Law Group PLLC

(57) ABSTRACT

Systems and methods for electromechanical oscillation monitoring are disclosed herein. In one embodiment, a method for monitoring electromechanical oscillation in a power system includes forming a power density spectrum in frequency domain based on phasor measurements collected from a plurality of locations in the power system and identifying an oscillation in the power density spectrum. The oscillation has a power density larger than other oscillations. The method also includes analyzing the identified oscillation in time domain to determine a damping characteristic of the identified oscillation and indicating that an insufficiently damped oscillation exists in the power system if the determined damping characteristic of the oscillation meets a predetermined condition.

22 Claims, 12 Drawing Sheets

SYSTEMS AND METHODS FOR ELECTROMECHANICAL OSCILLATION MONITORING

CROSS-REFERENCE TO RELATED APPLICATION(S)

This application claims the benefit of U.S. Provisional Application No. 61/067,996, entitled "SYSTEMS AND METHODS FOR ELECTROMECHANICAL OSCILLATION MONITORING USING FREQUENCY DOMAIN DECOMPOSITION," filed Mar. 4, 2008, the disclosure of which is hereby incorporated by reference in its entirety.

TECHNICAL FIELD

This disclosure relates to electrical power systems, and more particularly, to systems and methods for electromechanical oscillation monitoring in electrical power systems.

BACKGROUND

Low frequency electromechanical oscillations have been major concerns for long-distance power transfers in many power systems. Insufficient damping of power systems can lead to oscillations with growing magnitudes, as was the case with the WECC blackout on Aug. 10, 1996. Such global oscillations, as well as local oscillations involving only one or several generators, can be disruptive to the safe operation of power systems.

Traditional techniques for detecting and controlling these low frequency electromechanical oscillations include modal analysis and Prony analysis of phasor measurements collected during the disturbances. These techniques, however, cannot provide early warnings for the disturbances and can be generally referred to as post-disturbance type techniques.

The ambient type techniques have proven to be more well-suited for early warning type on line damping estimation. The ambient measurements of power systems are collected when the system is in a normal operating condition using random load changes across the entire system for input. However, currently known ambient type techniques cannot compute the mode shape of the oscillatory modes nor give damping ratio estimation for any system condition significantly different from the current condition. In many cases, the growing or poorly damped oscillations are triggered by some radical system condition change, e.g., tripping the transmission lines, etc. The ambient type methods cannot handle such unexpected system changes. Accordingly, certain improvements for detecting and controlling low frequency electromechanical oscillations in power systems are needed.

DETAILED DESCRIPTION

Figure 1:
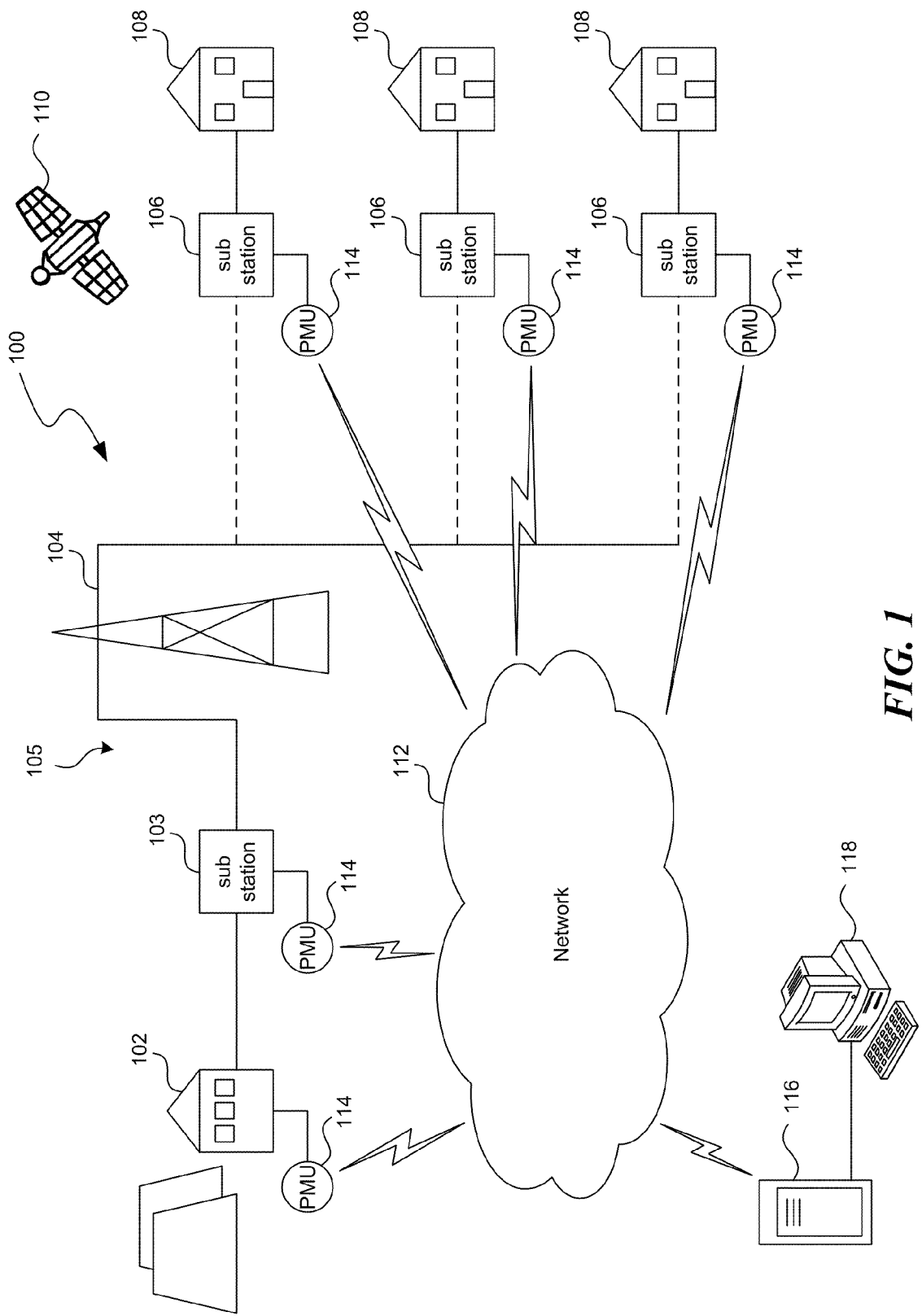
FIG. 1 is a schematic diagram of a power system in accordance with embodiments of the invention.

Specific details of several embodiments of the disclosure are described below with reference to systems and methods for monitoring and controlling low frequency electromechanical oscillations in power systems. Several embodiments can have configurations, components, or procedures different than those described in this section, and other embodiments may eliminate particular components or procedures. A person of ordinary skill in the relevant art, therefore, will understand that the invention may have other embodiments with additional elements, and/or may have other embodiments without several of the features shown and described below with reference to FIGS. 1-21.

Several embodiments of the invention relate to systems and methods for fast extraction of modal properties of poorly or insufficiently damped oscillatory modes by analyzing real-time phasor measurement unit ("PMU") data from synchrophasors in an electric power system. According to several embodiments, both the damping levels (e.g., damping ratios) and mode shape of oscillatory modes can be computed directly from ambient measurements without having to wait for system disturbances. Thus, potential oscillatory problems in the power system may be detected from relatively short time-windows of ambient PMU data in real-time so that corrective actions can be taken to counter the potential problems while they are still emerging.

Several embodiments of the technique include (1) applying Frequency Domain Decomposition ("FDD") to real-time ambient PMU measurements to derive a power density spectrum matrix and (2) applying Singular Value Decomposition ("SVD") to the power density spectrum matrix to identify dominant oscillatory modes. When applying the FDD and SVD techniques, the damping ratio, modal frequency, and mode shape of poorly damped (e.g., with less than 5% damping ratios) oscillatory modes can be directly determined from ambient PMU measurements. Several embodiments of the technique have been tested on past PMU recordings from real power systems as well as in the field at a cooperating power utility, as described in more detail below.

Theoretical Background

Without being bound by theory, the following description is believed to provide a theoretical background for a better understanding of various aspects of the systems and methods for monitoring and controlling low frequency electromechanical oscillations in power systems. The applicants do not attest to the scientific truthfulness of the following description.

1) Power Spectrum Representation

It is believed that a high-order nonlinear power system model can be linearized around its equilibrium point and expressed in the state space form as follows:

$$\Delta x = A\Delta x + B\Delta u \quad (1)$$

$$\Delta y = C\Delta x$$

where $\Delta x$ is the state vector, $\Delta u$ is the input vector, and $\Delta y$ is the output vector. As shown in [1, Page 720], the transfer function between the input and output has the following form, $$H(s) = \frac{\Delta y(s)}{\Delta u(s)} = \sum_{i=1}^{n} \frac{R_i}{s - \lambda_i} \quad (2)$$

where $R_i = C\phi_i\psi_i B$, $\phi_i$ and $\psi_i$ are the right and left eigenvectors corresponding to $\lambda_i = -\alpha_i + j\omega_i$, the eigenvalue of A, respectively. And n is the order of the system model. For a stationary random process x(i), its autocorrelation function is defined as $\gamma_{xx}(\tau) = E[x^*(t)x(t+\tau)]$, where the symbol * and E stand for the complex conjugate and the expectation, respectively. The power density spectrum or power spectral density (PSD) $S(\omega o)$ can be represented as the Fast Fourier transform ("FFT") of the above autocorrelation function by using the Wiener-Khintchine theorem. For a single-input, single-output ("SISO") system, the input and output power density spectrum has a simple relationship as $S_{yy}(\omega) = |H(\omega)|^2 S_{xx}(\omega)$. For the multi-input, multi-output ("MIMO") systems, the relationship is extended as follows:

$$S_{YY}(\omega) = H(j\omega) \cdot S_{XX}(\omega) \cdot H(j\omega)^H \quad (3)$$

where the superscript H denotes a complex conjugate transpose.

If the inputs are white noise, the power spectrum $S_{XX}(\omega)$ is believed to be a constant diagonal matrix, denoted by F. For white noise, the following expression of $S_{YY}(\omega)$ is believed to hold:

$$S_{YY}(\omega) = \sum_{i=1}^{n}\left[\frac{A_i}{j\omega - \lambda_i} - \frac{A_i^H}{j\omega + \lambda_i^*}\right] \quad (4)$$

where $$A_i = R_i F \sum_{k=1}^{n} \frac{-R_k^H}{\lambda_i + \lambda_k^*}.$$

2) Power Spectrum Decomposition Using SVD

The peaks in $S_{YY}(\omega)$ correspond to poorly damped modes of the system. The phrase "poorly damped modes" or "insufficiently damped modes" generally refers to modes (i.e., frequencies, phases, etc.) that have insufficient damping. For example, the poorly damped modes can include underdamped modes. In another example, the poorly damped modes may include critically damped or over damped systems in which additional damping may be desired. As described in more detail below, the inverse FFT of decomposed spectrum $S_{YY}(\omega)$ has an exponential form and can be further processed by Prony analysis and/or other suitable analysis for determining damping ratios of the decomposed spectrum.

2.1) It is believed that when $S_{YY}(\omega)$ is evaluated near the frequency of a poorly damped mode $\lambda_r = -\alpha_r + j\omega_r$, $S_{YY}(\omega)$ evaluated near $\omega_r$ can be approximated by a rank one matrix, assuming there is no significant contribution from other poorly damped modes nearby. The r-th residue term $A_r$ has the following form:

$$A_r = R_r F \sum_{k=1}^{n} \frac{-R_k^H}{\lambda_r + \lambda_k^*} \quad (5)$$

$$= \frac{-R_r F R_r^H}{\lambda_r + \lambda_r^*} + R_r F \sum_{\substack{k=1 \\ k \neq r}}^{n} \frac{-R_k^H}{\lambda_r + \lambda_k^*}$$

$$= \frac{R_r F R_r^H}{2\alpha_r} + R_r F \sum_{\substack{k=1 \\ k \neq r}}^{n} \frac{-R_k^H}{\lambda_r + \lambda_k^*}$$

When $\alpha_r$ is small, i.e., when $\lambda_r$ is close to the imaginary axis in the S-plane, the first term is much larger than the remaining terms, $A_r$ can be approximated as $$\frac{R_r F R_r^H}{2\alpha_r}$$

and now $A_r = A_r^H$. If there are no other poorly damped modes near $\omega_r$, the contributions from the other terms in equation (4) are negligible for $S_{YY}(\omega)$ near $\omega_r$, and $S_{YY}(\omega)$ can be approximated as follows:

$$S_{YY}(\omega)\Big|_{\omega\,near\,\omega_r} \approx \frac{A_r}{\alpha_r + j(\omega - \omega_r)} - \frac{A_r}{-\alpha_r + j(\omega - \omega_r)} \quad (6)$$

$$= \frac{R_r F R_r^H}{\alpha_r^2 + (\omega - \omega_r)^2}$$

Let $R_i = w_i l_i^H$, where $w_i = C\phi_i$ and $l_i^H = \psi_i B$ are mode shape and mode participation, respectively. Then, $$S_{YY}(\omega)\Big|_{\omega\,near\,\omega_r} \approx \frac{w_r l_r^H F l_r w_r^H}{\alpha_r^2 + (\omega - \omega_r)^2} \quad (7)$$

$$= \frac{w_r d_r w_r^H}{\alpha_r^2 + (\omega - \omega_r)^2}$$

$$= s_r(\omega) w_r w_r^H$$

where $d_r = l_{rH} F l_r$ and $$s_r(\omega) = \frac{d_r}{\alpha_r^2 + (\omega - \omega_r)^2}$$

are scalars. And the expression (7) is a rank one matrix.

2.2) The rank determined by SVD of $S_{YY}(\omega)$ corresponds to the number of contributing modes when $S_{YY}(\omega)$ is evaluated near $\omega_r$. If there are several poorly damped modes near $\omega_r$, then there would be several terms that make $\alpha_r^2+(\omega-\omega_r)^2$ small, resulting in more terms in equation (7). Usually the number of these terms is small. If these $s_r(\omega)$'s are sorted by their influence on $S_{YY}(\omega)$ near $\omega_r$ in decreasing order and only the first $n_o$ terms are taken, then $S_{YY}(\omega)$ near $\omega_r$ can be expressed as $$S_{YY}(\omega)|_{\omega\, near\, \omega_r} \approx [w_{r,1}, \ldots, w_{r,n_o}] \quad (8)$$

$$\begin{bmatrix} s_{r,1}(\omega) & & \\ & \ddots & \\ & & s_{r,n_o}(\omega) \end{bmatrix} \begin{bmatrix} w_{r,1}^H \\ \vdots \\ w_{r,n_o}^H \end{bmatrix}$$

$$= WS(\omega)W^H$$

where $n_o$ is the total number of outputs. And $s_{r,i}(\omega)$ is the i-th most influential mode on $S_{YY}(\omega)$ near $\omega_r$ and usually the most influential mode is $\lambda_r$. The columns of W are linearly independent because they are mode shape vectors corresponding to distinct eigenvalues. W does not depend on $\omega$.

Equation (8) is related to the SVD of $S_{YY}(\omega)$ near $\omega_r$ as follows:

$$S_{YY}(\omega)|_{\omega\, near\, \omega_r} = [u_1(\omega), \ldots, u_{n_o}(\omega)] \quad (9)$$

$$\begin{bmatrix} \sigma_1(\omega) & & \\ & \ddots & \\ & & \sigma_{n_o}(\omega) \end{bmatrix} \begin{bmatrix} v_1(\omega)^H \\ \vdots \\ v_{n_o}(\omega)^H \end{bmatrix}$$

$$= U(\omega)\Sigma(\omega)V(\omega)^H$$

where U and V are unitary matrix, i.e., $UU^H=I$, $VV^H=I$, I is identity matrix, H denotes complex conjugate transpose. $\Sigma$ is a diagonal matrix with singular values on the diagonal in decreasing order. Since $S_{YY}(\omega)$ is a Hermitian matrix, we have U=V, and then equation (9) becomes $$S_{YY}(\omega)|_{\omega\, near\, \omega_r} = U(\omega)\Sigma(\omega)U(\omega)^H \quad (10)$$

Since U in equation (10) and W in equation (8) are both $n_o \times n_o$ nonsingular matrices, they are related by $U(\omega)=WQ(\omega)$, where Q is a nonsingular matrix. Comparing equations (8) and (10) above would yield:

$$S(\omega)=Q(\omega)\Sigma(\omega)Q(\omega)^H \quad (11)$$

Thus the rank of $\Sigma$ and S are believed to be the same, and the rank of $S_{YY}(\omega)$ evaluated near $\omega_r$, equivalent to the number of nonzero singular values, is the same as the number of nonzero terms in $S(\omega)$, i.e., the number of contributing terms. In most cases, only one or two modes are believed to show significant contribution to $S_{YY}(\omega)$ near $\omega_r$ other than the mode $\lambda_r$ itself.

3) Mode Identification

If there are no close modes nearby, $S_{YY}(\omega)$ evaluated near $\omega_r$ can be approximated by a rank one matrix as shown in equation (7). When applying SVD to $S_{YY}(\omega)$ near $\omega_r$, the resulting singular values are believed to be very small, except for $\sigma_1$. So, equation (11) becomes $S(\omega)=\sigma_1(\omega)q_1(\omega)q_1(\omega)^H$, where $q_1$ is the first column of Q, and $s_r(\omega)=\sigma_1(\omega)q_{11}(\omega)q_{11}(\omega)^H$, where $q_{11}$ is the first element of $q_1$.

Because $U(\omega)=WQ(\omega)$, $u_1(\omega)=w_r q_{11}(\omega)$. Since $u_1^H(\omega)u_1(\omega)=1$, so $q_{11}(\omega)^H q_{11}(\omega)=1/(w_r^H w_r)$, thus $s_r(\omega)=\sigma_1(\omega)/(w_r^H w_r)$. As a result, the largest singular value $\sigma_1(\omega)$ is proportional to $s_r(\omega)$, and the first left singular vector $u_1(\omega)$ is a normalized version of mode shape $w_r$. Now take the inverse FFT for the largest singular value $\sigma_1$, i.e., the scaled version of $s_r$. Note the Fourier transform pair $$f(t) = e^{-\alpha|t|} \leftrightarrow F(\omega) = \frac{2\alpha}{\alpha^2 + \omega^2},$$

and by using the frequency domain shifting property, $$\sigma_1(\omega) = \eta s_r(\omega) \quad (12)$$

$$= \frac{\eta d_r}{\alpha_r^2 + (\omega - \omega_r)^2}$$

$$= \frac{\eta d_r}{2\alpha_r} \cdot \frac{2\alpha_r}{\alpha_r^2 + (\omega - \omega_r)^2} \leftrightarrow f(t)$$

$$= \frac{\eta d_r}{2\alpha_r} e^{-\alpha_r|t|} e^{j\omega_r t}$$

$$= B e^{-\alpha_r|t|} e^{j\omega_r t}$$

where $\eta=w_r^H w_r$ is a scalar, $$B = \frac{\eta d_r}{2\alpha_r}.$$

For the part t>0, f(t) is in an exponential form as follows:

$$f(t)=Be^{(-\alpha_r+j\omega_r)t}=Be^{\lambda_r t} \quad (13)$$

The exponential form above can be processed by a simple logarithmic decrement technique and/or other suitable techniques for damping estimation. For example, the descriptions below use the methods in Prony analysis, including Prony's method, Matrix Pencil Method, and Hankel Total Least Squares ("HTLS") method. In other examples, other suitable damping estimation techniques may be used. In the case of multiple contributing modes, if the modes are orthogonal, the SVD process decomposes their impacts into separate singular values. Now Q is a diagonal matrix, and each singular value corresponds to a single mode and its left singular vector corresponds to the mode shape. If the modes are non-orthogonal, Q is not a diagonal and the modes are not completely decomposed. In this case, Prony analysis may be more appropriate than logarithmic decrement technique for single mode identification.

Systems for Monitoring and Controlling Low Frequency Electromechanical Oscillations FIG. 1 is a schematic diagram of a power system 100 in accordance with embodiments of the invention. As shown in FIG. 1, the power system 100 can include a power generating plant 102, a step-up substation 103, a transmission tower 104, a plurality of step-down substations 106, and a plurality of power consuming loads 108 interconnected with one another by a power grid 105. Even though only certain system components (e.g., one power generating plant 102 and one step-up substation 103) are illustrated in FIG. 1, in other embodiments, the power system 100 and/or the power grid 105 can include other system components in addition to or in lieu of those components shown in FIG. 1.

The power system 100 can also include a plurality of PMUs 114 individually coupled to various components of the power system 100. For example, as illustrated in FIG. 1, the power generating plant 102, the step-up substation 103, and each of the step-down substations 106 include one PMU 114. The PMUs 114 can be configured to measure current conditions (e.g., as represented by voltage, current, and/or other types of phasor measurements) of the transmitted power in the power system 100 based on a common time reference (e.g., a GPS satellite 110).

The power system 100 can also include a power data concentrator ("PDC") 116 operatively coupled to the PMUs 114 via a network 112 (e.g., an internet, an intranet, a wide area network, and/or other suitable types of network). The PDC 116 can include a logic processing device (e.g., a network server, a personal computer, etc.) configured to "align" phasor measurements from the PMUs 114 based on their time stamps with reference to the GPS satellite 110. In the illustrated embodiment, the power system 100 includes an optional supervisory computer station 118 operatively coupled to the PDC 116. The supervisory computer station 118 can be configured to retrieve phasor measurements from the PDC 116 and analyze the retrieved data in order to monitor and controlling electromechanical oscillation in the power system 100, as described in more detail below with reference to FIGS. 2 and 3. In other embodiments, the PDC 116 can analyze the phasor measurements received from the PMUs 114 and provide the analysis results to the supervisory computer station 118. In further embodiments, the power system 100 can include an analysis processor (not shown) operatively coupled to the PDC 116 and the supervisory computer station 118 to analyze the phasor measurements collected by the PMUs 114.

Figure 2:
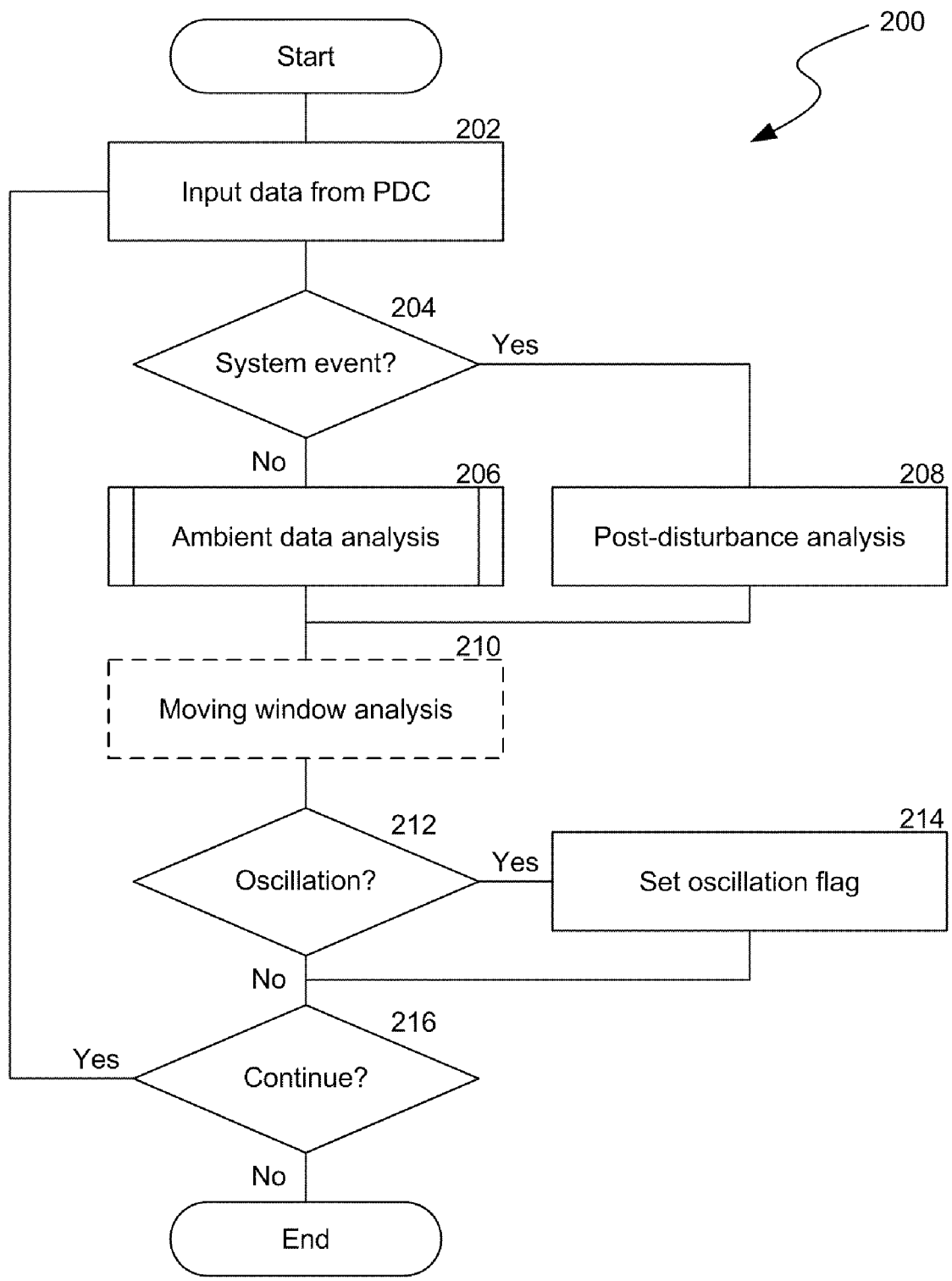
FIG. 2 is a flowchart illustrating a method for electromechanical oscillation monitoring in accordance with embodiments of the invention.

FIG. 2 is a flowchart illustrating a method 200 for electromechanical oscillation monitoring in accordance with embodiments of the invention. Even though the method 200 is described below with reference to the power system 100 of FIG. 1, one skilled in the art will recognize that several embodiments of the method 200 can also be implemented in other power systems with similar or different system configurations.

Referring to FIGS. 1 and 2 together, the method 200 can include inputting data from the PDC 116 (block 202). In one embodiment, the data from the PDC 116 include phasor measurements collected by the PMUs 114 over a certain period of time (e.g., 2 minutes or other suitable time periods, referred to hereinafter as a "window"). In other embodiments, the data from the PDC 116 can include other types of measurements collected by the PMUs 114 over the same or different period of time.

The method 200 can also include determining whether a system event has occurred in the power system 100 (block 204). In one embodiment, a system event is indicated if a transmission line and/or a substation in the power system 100 has been tripped. In other embodiments, a system event can be indicated if the power generating plant 102 and/or other components of the power system 100 indicates an abnormal and/or different operation. In further embodiments, a system event can be indicated based on other interruptions, disturbances, and/or other selected conditions of the power system 100.

If a system event is indicated, the method 200 can include performing post disturbance analysis on the data retrieved from the PDC 116 (block 208). In one embodiment, performing the post disturbance analysis can include performing a Prony analysis on the retrieved data to identify the source(s) of the disturbance (e.g., the mode shapes) that caused the system event in the power system 100. In other embodiments, performing the post disturbance analysis can also include reviewing measurement history and/or applying other suitable techniques to the retrieved data to identify the mode shapes.

If a system event is not indicated, the method 200 can include performing an ambient data analysis on the retrieved data from the PDC 116 to identify poorly damped low frequency electromechanical oscillations based on the retrieved ambient data (block 206). As described in more detail below with reference to FIG. 3, several embodiments of performing the ambient data analysis can identify both the mode shapes and the damping ratios of the mode shapes in one analysis procedure.

Optionally, the method 200 can also include performing a moving window analysis based on the ambient data analysis and the post-disturbance analysis (block 210). For example, in certain embodiments, if a system event is not indicated in a first time period, the method 200 can include performing the ambient data analysis on the retrieved data collected in the first time period to identify low frequency electromechanical oscillations that may potentially cause disturbances in the power system 100. At a second time period after the first time period, if a system event is indicated, the method 200 can include performing the post-disturbance analysis on newly retrieved data collected in the second time period and comparing the results of the post-disturbance analysis with those of the ambient data analysis to confirm the predicted disturbances in the power system 100. In other embodiments, performing a moving window analysis can be omitted.

The method 200 can further include a decision at block 212 to determine whether any oscillation is detected based on the results of the ambient data analysis and/or the post-disturbance analysis. In one embodiment, if an oscillation is identified with a damping ratio below a predetermined threshold (e.g., about 3%), an oscillation is indicated. In other embodiments, the oscillation can be indicated based on frequencies, phases, and/or other suitable conditions.

If an oscillation is indicated, the method 200 can include setting an oscillation flag (block 214). The oscillation flag can further trigger alarms, control interlocks, and/or other suitable system responses. The method 200 further includes a decision block 216 to determine whether the process should continue based on, for example, operator input. If the process is indicated to continue, the process reverts to inputting data from the PDC at block 202. Otherwise, the process ends.

Optionally, the method 200 can also include testing the stationarity of retrieved data from the PDC 116. If the retrieved data is determined to be nonstationary, the method 200 can include setting a flag indicating that the data does not pass the Reverse Arrangement Test. In certain embodiments, the method 200 can include testing the stationarity of the measurements before they are further processed. It is believed that many types of nonstationarity, including trend, increasing variance, changing frequency components, etc. may exist. In several embodiments, a method called the Reverse Arrangement Test may be used to detect most common forms of nonstationarity, especially trend, in the data. First, from a set of observations $x_1, x_2, \ldots x_N$, define the following function:

$$h_{ij} = \begin{cases} 1 & \text{if } x_i > x_j \\ 0 & \text{otherwise} \end{cases} \quad (14)$$

Then calculate $$A = \sum_{j=1}^{N-1} A_j,$$

where $A_i = \sum_{j=i+1}^{N} h_{ij}.$

A is the total number of reverse arrangement, and its value will fall into some range with some level of significance if the observations are stationary.

Figure 3:
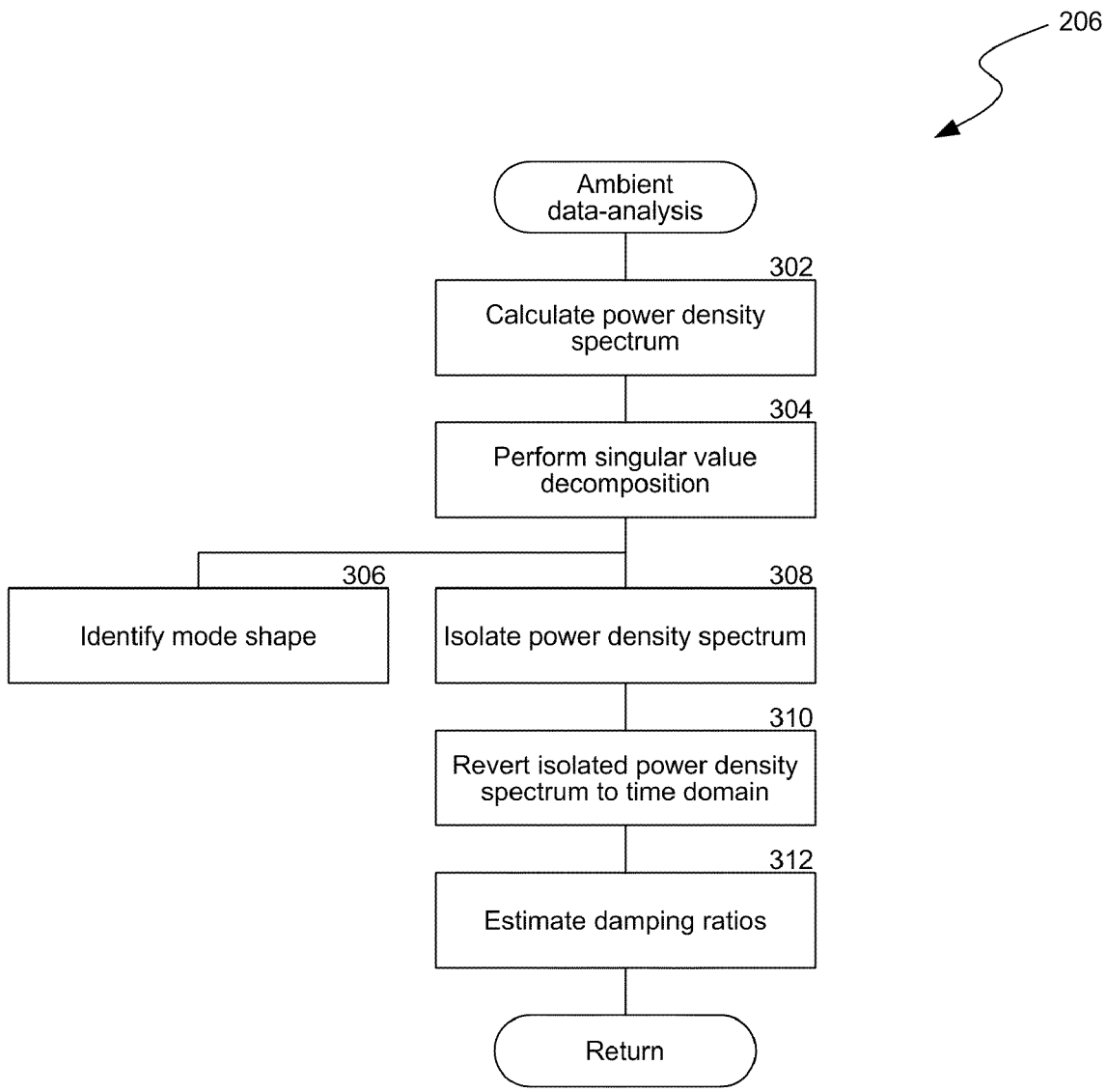
FIG. 3 is a flowchart illustrating a method for performing an ambient data analysis in accordance with embodiments of the invention.

FIG. 3 is a flowchart illustrating embodiments of a method 206 for performing an ambient data analysis in accordance with embodiments of the invention. As shown in FIG. 3, the method 206 can include calculating a power density spectrum from the retrieved data from the PDC 116 using FDD (block 302). In one embodiment, calculating the power density spectrum can include estimating the auto and/or cross power density spectrum by a multi-taper method to form a power spectrum matrix. In other embodiments, calculating the power density spectrum can include applying the FFT analysis to the retrieved data from the PDC 116.

As shown in the foregoing theoretical description, FDD is able to handle multiple phasor measurements. However, with the growing number of measurements, the computation for power density spectrum matrix and the later SVD's performed at each spectrum line may grow dramatically. Thus the capability of online computation may require only a small number of measurements used for each FDD analysis. With the fast spread of PMUs 114 installations across the power system 100, in several embodiments, it may be necessary to group these phasor measurements effectively to provide both local information and global view.

In certain embodiments, a hierarchical solution is applied to group the phasor measurements. For example, data from each PMU 114 can be grouped together and analyzed in parallel by multi-threading. Each PMU 114 may contain 5 to 10 signals. The individual PMU's contain local information, but they may produce inconsistent results for a global event. For this reason, signal groups may be formed for global information. The signal groups may be formed automatically when more than one local PMU 114 indicate insufficient damping at a similar frequency. The signals are drawn from the PMUs that show similar dominant frequency component, and they are analyzed by FDD to provide a more consistent view for events involving many PMUs.

Unlike the application of FDD in other fields, the estimation of power density spectrum using FDD may be a problem for oscillation monitoring. The reason is that the power system is basically time-varying, and the system condition keeps changing from time to time. Even when the system is operating in a normal state for a long time, a small amount of ambient data may be used to give the system operator sufficient time for preventive control. However, the use of short-time ambient measurements tends to decrease the accuracy of the power density spectrum.

One conventional spectrum estimation technique is by periodogram, which is known to be an inconsistent estimate of the true spectrum with significant bias, especially when the data are short and Signal Noise Ratio ("SNR") is low. Several embodiments of the method 206 may use the technique of windowing and moving window average (e.g., the nonparametric method of Multi-Taper Method ("MTM")) to reduce the bias. The examples in later part of this disclosure show that 3 to 5 minutes of data are sufficient for spectrum estimation by MTM.

The method 206 can also include performing a SVD on the calculated power density spectrum within a frequency range of interest (e.g., 0.1 to 2.0 Hz or other desired frequency range) for oscillation monitoring (block 304). In one embodiment, applying SVD to the power density spectrum matrix includes plotting the largest singular value versus frequency and determining the peak in the plot. In other embodiments, performing SVD on the power density spectrum can include performing other types of analysis on the calculated power density spectrum.

The method 206 can also include isolating the power density spectrum based on the singular values determined from performing the SVD on the power density spectrum (block 308) and identifying the mode based on the singular values (block 306). As shown in the theoretical part, the largest singular value corresponds to the strongest mode near a poorly damped mode. If the system contains several well separated poorly-damped modes, there may be several peaks in a plot of largest singular values versus frequencies. Usually this plot of singular values versus frequency is in log scale and called Complex Mode Indication Function ("CMIF") plot.

The boundary for each mode is then determined. Since the first left singular vector is a normalized version of mode shape, optionally, Modal Assurance Criterion ("MAC") may be used to determine whether a specific singular value belongs to a nearby mode or not. MAC provides a measure of degree of similarity between two vectors, and it is defined as follows.

$$MAC(\psi_A, \psi_B) = \frac{|\psi_A^H \psi_B|^2}{\psi_A^H \psi_A \cdot \psi_B^H \psi_B} \tag{15}$$

$\psi_A$ is taken as the left singular vector corresponding to a peak in largest singular value plot. $\psi_B$ is searched in a nearby frequency region until the MAC is below some prespecified value. The value of 0.9 is used in this detailed description, and any singular vector that has a MAC value larger than 0.9 is considered to belong to the same mode.

The method 206 can further include reverting the isolated power density spectrum to time domain by, for example, performing an inverse FFT on the isolated power density spectrum (block 310). The method 206 can then further include estimating damping ratios in time domain based on the isolated power density spectrum according to, for example, Prony analysis (block 312). Optionally, in certain embodiments, the singular values for a specific mode can be tested for truncation. If sever truncation is observed, a flag can be set to show that the result might not be reliable.

Test on Systems with Different Damping Ratios

Figure 4:
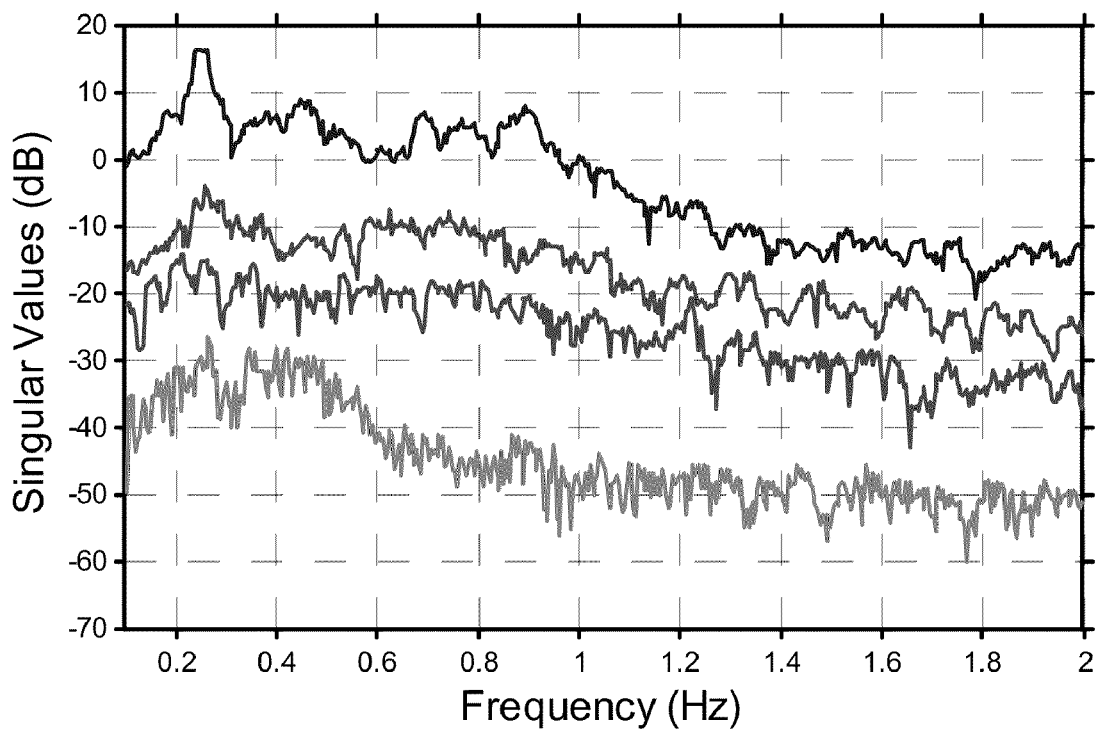
FIG. 4 is a singular value versus frequency diagram in accordance with an embodiment of the invention.

In this subsection, several embodiments of the method 200 were tested against simulation data for known systems. First, a system with a poorly damped mode was tested. Usually, for purposes of illustration, a mode with a damping ratio less than 3% is considered poorly damped, while a mode with a damping ratio larger than 8% is well damped. A linear time-invariant ("LTI") system with four pairs of poles was created in state space form as in equation (1). The order of matrix A is 8, with four modes at 0.25, 0.4, 0.7, and 0.9 Hz, respectively. Except that the mode at 0.25 Hz has a damping ratio of 0.02 or +2%, all the damping ratios for all the other modes were 0.10. The system had 2 inputs and 4 outputs. The system was excited by Gaussian white noise, and measurement noises with 10 dB SNR were added to the outputs. After applying SVD to the spectrum matrix at each frequency line, CMIF plot, i.e., the plot of singular values versus frequency in log scale, was generated as shown in FIG. 4. The blue curve in the top of the figure corresponds to the largest singular value, and the peak around 0.25 Hz is clearly visible. The second largest singular values are much less than the largest one, which is around 0.25 Hz, which means that the spectrum around the dominant mode is effectively affected by only one mode.

Figure 5:
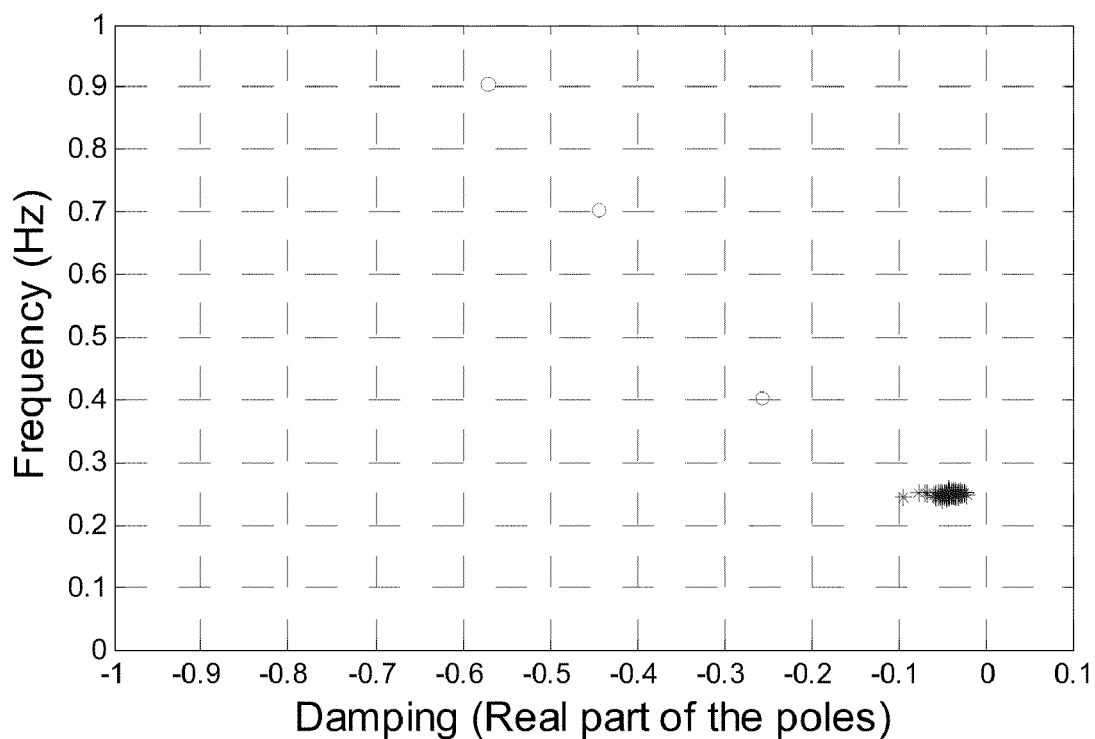
FIG. 5 is a frequency versus damping level diagram in accordance with an embodiment of the invention.

The test was repeated 100 times, and FDD was performed around the highest peak in the CMIF plot. The results were shown in the complex S-plane with y-axis scaled by $1/(2\pi)$ to show the frequency, while the x-axis remains unchanged. In FIG. 5, the red circle symbolizes the true system mode and the blue star symbolizes the identified mode. The mean and standard deviation of 100 identified frequencies are 0.2490 Hz, and 0.0027 Hz respectively. The mean and standard deviation of the damping ratios are 0.0257 and 0.0074, respectively. Comparing the results to the true values, it is concluded that FDD can identify the dominant frequency and damping ratio very well under noisy environments.

Figure 6:
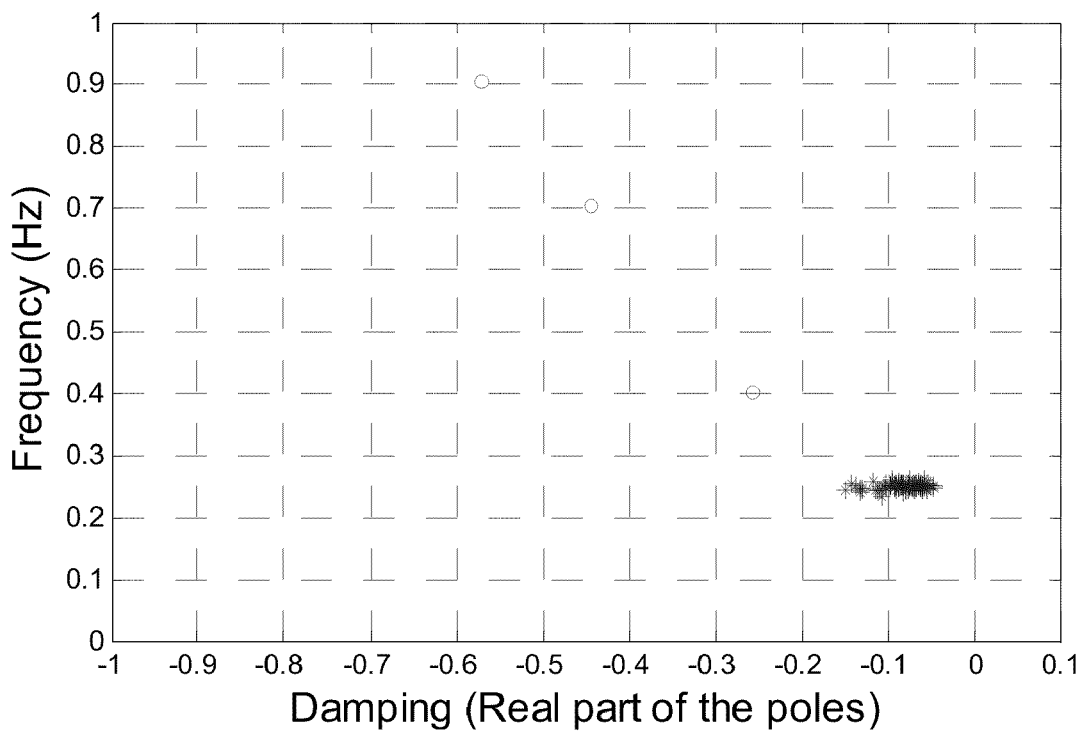
FIG. 6 is a frequency versus damping level diagram in accordance with another embodiment of the invention.

Next, a medium damped system was tested. The system was similar to the previous system, but the damping ratio of 0.25 Hz mode was changed to 0.05. The FDD results for 100 simulation tests are shown in FIG. 6. The mean and standard deviation of 100 identified frequencies are 0.2504 Hz and 0.0046 Hz, respectively. The mean and standard deviation of the damping ratios are 0.0506 and 0.0138, respectively. The estimated frequencies are accurate and have a small variance. However, the damping ratio estimates had larger variance than in the poorly damped case.

Figure 7:
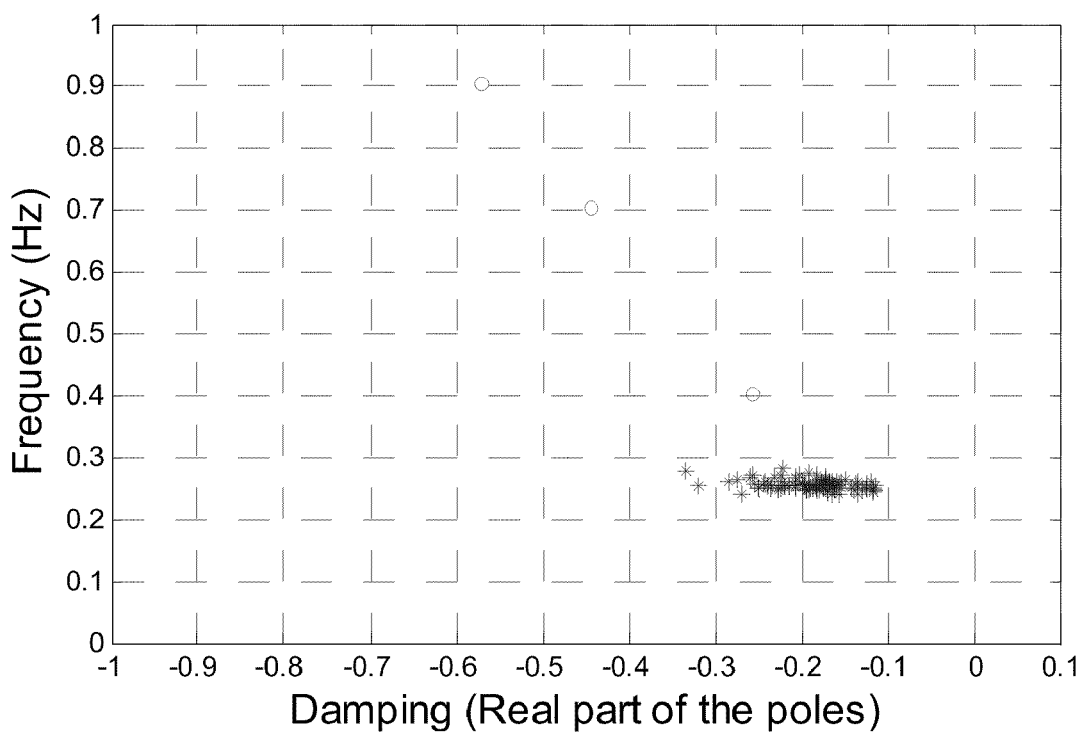
FIG. 7 is a frequency versus damping level diagram in accordance with another embodiment of the invention.
Figure 8:
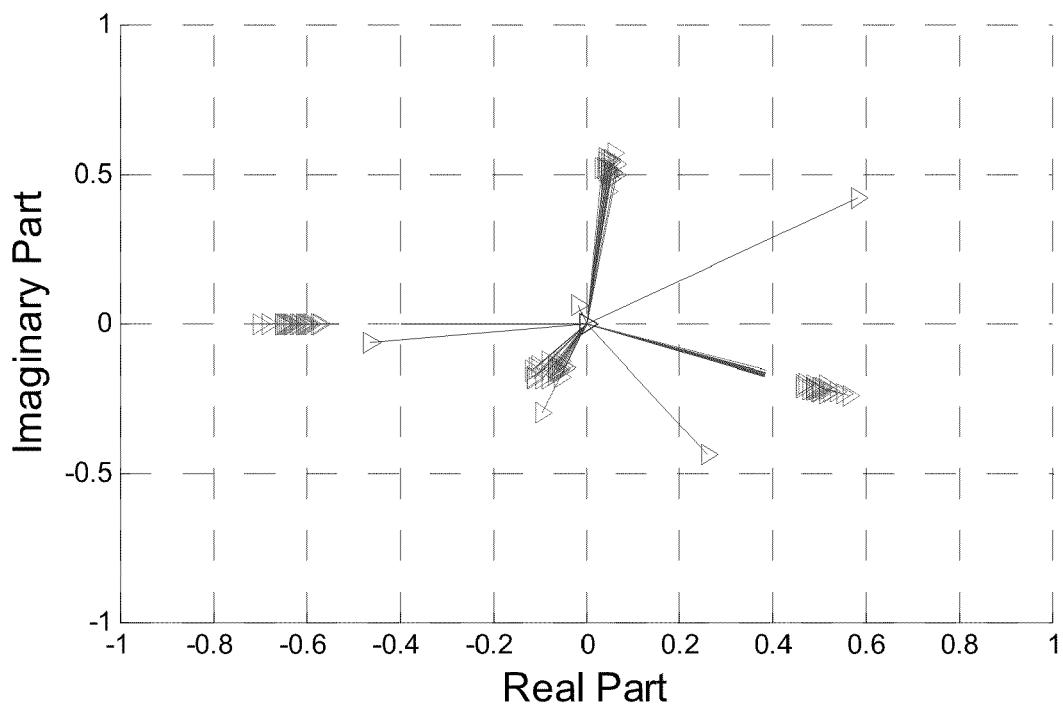
FIG. 8 is a mode shape diagram in accordance with another embodiment of the invention.

In the third case, a well damped system was tested. The damping ratio of 0.25 Hz mode was changed to 0.10 in this case. The FDD results for 100 simulation tests are shown in FIG. 7. The mean and standard deviation of 100 identified frequencies are 0.2577 Hz and 0.0080 Hz, respectively. The mean and standard deviation of the damping ratios are 0.1143 and 0.0248, respectively. A large variance in the damping ratio is not surprising because the approximation in FDD is now very poor considering that the actual pole is so far from the imaginary axis. Other tests on well damped systems indicate that even the mean damping ratio can be biased in some cases; thus, FDD may not be reliable for identifying well damped modes.

Test with Different Data Lengths

To determine the appropriate data length for real-time applications, the performances of FDD was tested for different data lengths on the foregoing systems. One hundred tests were performed for each data length and the mean and standard deviation of the frequency and damping ratio estimates were compared. The results of the poorly, medium and well damped system are shown in Tables I, II and III, respectively.

TABLE I

EFFECT OF DATA LENGTH ON THE RESULTS OF FDD
(0.02 DAMPING RATIO)

| Data Length (minutes) | Mean frequency (Hz) | Standard deviation for frequency (Hz) | Mean damping ratio | Standard deviation for damping ratio |
| --- | --- | --- | --- | --- |
| 2 | 0.2495 | 0.0040 | 0.0409 | 0.0081 |
| 3 | 0.2498 | 0.0027 | 0.0255 | 0.0074 |
| 4 | 0.2492 | 0.0027 | 0.0196 | 0.0066 |
| 5 | 0.2491 | 0.0021 | 0.0168 | 0.0056 |
| 8 | 0.2494 | 0.0017 | 0.0137 | 0.0041 |
| 10 | 0.2493 | 0.0014 | 0.0128 | 0.0038 |

TABLE II

EFFECT OF DATA LENGTH ON THE RESULTS OF FDD
(0.05 DAMPING RATIO)

| Data Length (minutes) | Mean frequency (Hz) | Standard deviation for frequency (Hz) | Mean damping ratio | Standard deviation for damping ratio |
| --- | --- | --- | --- | --- |
| 2 | 0.2496 | 0.0053 | 0.0672 | 0.0181 |
| 3 | 0.2504 | 0044 | 0.0519 | 0.0130 |
| 4 | 0.2505 | 0.0040 | 0.0474 | 0.0127 |
| 5 | 0.2497 | 0.0032 | 0.0425 | 0.0096 |
| 8 | 0.2501 | 0.0027 | 0.0398 | 0.0082 |
| 10 | 0.2498 | 0.0023 | 0.0402 | 0.0086 |

TABLE III

EFFECT OF DATA LENGTH ON THE RESULTS OF FDD
(0.10 DAMPING RATIO)

| Data Length (minutes) | Mean frequency (Hz) | Standard deviation for frequency (Hz) | Mean damping ratio | Standard deviation for damping ratio |
| --- | --- | --- | --- | --- |
| 2 | 0.2597 | 0.0113 | 0.1339 | 0.0292 |
| 3 | 0.2564 | 0.0083 | 0.1263 | 0.0249 |
| 4 | 0.2560 | 0.0066 | 0.1155 | 0.0260 |
| 5 | 0.2550 | 0.0055 | 0.1156 | 0.0229 |
| 8 | 0.2551 | 0.0056 | 0.1132 | 0.0193 |
| 10 | 0.2550 | 0.0042 | 0.1111 | 0.0161 |

As shown in Tables I, II and III, the frequency estimates are all very good and longer data lengths provide smaller variances for all three systems. For damping ratio estimation, the estimates of the poorly damped system are better than the well damped case with smaller variances observed. For each system, if the data length is too short, like the 2 minutes of data case, the damping ratio gets severely biased with large variance. Longer data lengths tend to have better spectrum estimation and gives smaller variances for damping ratio estimation, but the effect of the underestimation is more significant. Also, for the purpose of oscillation monitoring, the shortest data length are preferred. For these reasons, 3 to 5 minutes data are considered enough for FDD application in ambient data processing.

Some Features of the Method 200

Several embodiments of the method 200 can provide improved damping estimation for at least poorly damped modes over conventional techniques. Several embodiments of the method 200 can also include the following features:

1) Robustness for Measurement Noise.

One feature of several embodiments of the method 200 is that it may be more robust under noisy environment than time domain methods. In the following example, a poorly damped system is excited by white noise, and three minutes of outputs are contaminated by different levels of measurement noises. One hundred tests were performed for each noise level, and the mean and standard deviation of the frequency and damping ratio estimates are compared in Table IV.

TABLE IV

EFFECT OF MEASUREMENT NOISE ON THE RESULTS OF FDD
(0.02 DAMPING RATIO)

| SNR (dB) | Mean frequency (Hz) | Standard deviation for frequency (Hz) | Mean damping ratio | Standard deviation for damping ratio |
|---|---|---|---|---|
| 40 | 0.2495 | 0.0028 | 0.0264 | 0.0068 |
| 30 | 0.2496 | 0.0031 | 0.0273 | 0.0078 |
| 20 | 0.2493 | 0.0029 | 0.0263 | 0.0062 |
| 10 | 0.2495 | 0.0028 | 0.0264 | 0.0083 |
| 5 | 0.2492 | 0.0027 | 0.0255 | 0.0069 |

The result in Table IV shows that several embodiments of the method 200 can produce good estimates even under very noisy environments. The robustness of several embodiments of the method 200 is believed to be a result of the relatively low noise energy in the frequency band between 0.1 and 2 Hz and also due to the SVD performed in the process.

2) Mode Shape Identification.

Figure 9:
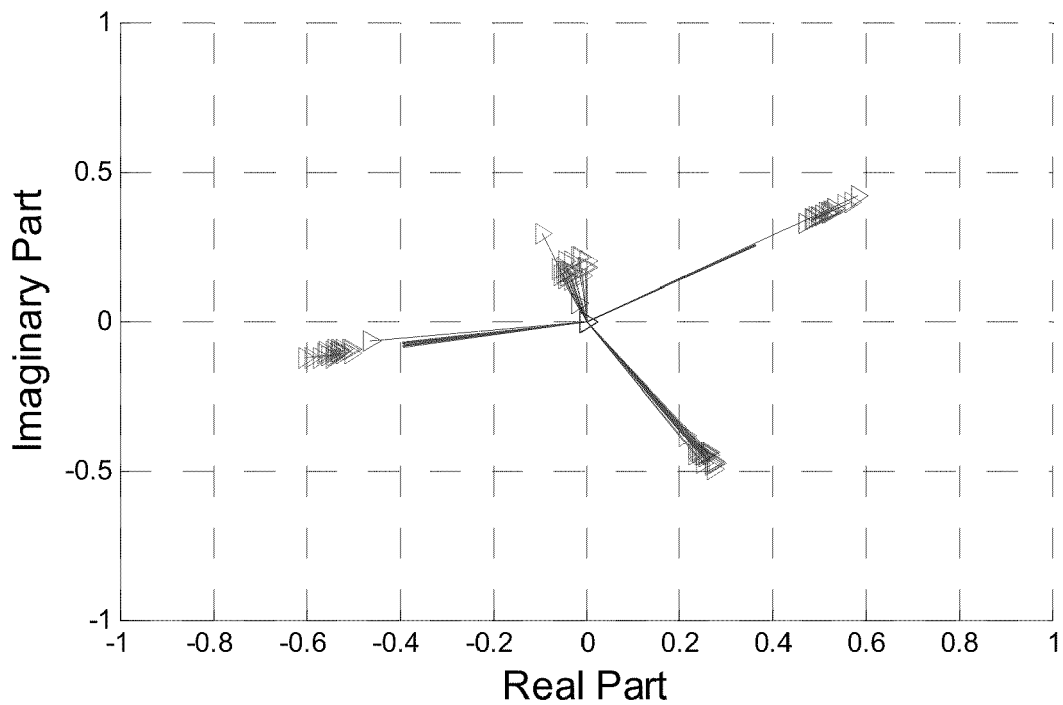
FIG. 9 is a mode shape diagram in accordance with another embodiment of the invention.

As discussed above, the singular vector corresponding to the largest singular value near a poorly damped mode is a scaled version of its mode shape. This means that the FDD techniques used in several embodiments of the method 200 can also give mode shape estimation. For a poorly damped system, the simulation was repeated 20 times and the estimated mode shape is plotted in FIG. 8. The solid lines correspond to the normalized true mode shape, and the dashed lines correspond to the mode shapes estimated by FDD. Note that the SVD process leads to unique left or right singular vectors, up to a multiplication of a unit phase factor $e^{j\Phi}$. This multiplication of a unit phase factor $e^{j\Phi}$ is in fact a rotation in the complex plane. If we rotate the estimated mode shape in FIG. 8, they would match the normalized true mode shape quite accurately to that shown in FIG. 9, showing the capability of FDD to estimate mode shapes. In practice, only the relative angle difference between mode-shape elements matters, and we don't actually need to rotate the mode shape estimated by FDD. The mode shape information can provide more information for understanding the nature of the oscillatory modes of interest. Thus, the capability of FDD to estimate mode shape is an important advantage over other time domain methods.

3) Correlated Inputs

The basic assumption for ambient data analysis is that the system is excited by load variation modeled by white noises. In the previous tests, these white noises were assumed to be completely independent. However, the load variation can be correlated spatially, for example, due to the temperature rise in a specific region. In the following test, temporally independent but spatially correlated inputs were applied to the poorly damped system. The correlation matrix between the two inputs is as follows:

$$C = \begin{bmatrix} 1 & \rho \\ \rho & 1 \end{bmatrix}$$

where $\rho$ is a correlation coefficient.

The result is shown in Table V, and it shows that FDD is able to handle spatially correlated inputs with reasonable accuracy. Besides spatially correlated inputs, FDD also works for relatively flat input spectrum; thus, the basic assumption can be relaxed a little, making FDD more applicable in real world applications.

TABLE V

EFFECT OF CORRELATED INPUTS ON THE RESULTS OF FDD
(0.02 DAMPING RATIO)

| ρ | Mean frequency (Hz) | Standard deviation for frequency (Hz) | Mean damping ratio | Standard deviation for damping ratio |
|---|---|---|---|---|
| 0 | 0.2496 | 0.0034 | 0.0266 | 0.0074 |
| 0.1000 | 0.2498 | 0.0031 | 0.0264 | 0.0086 |
| 0.3000 | 0.2488 | 0.0028 | 0.0255 | 0.0077 |
| 0.5000 | 0.2488 | 0.0040 | 0.0274 | 0.0093 |
| 0.7000 | 0.2494 | 0.0028 | 0.0252 | 0.0082 |

4) Identification of Close Modes.

Figure 10:
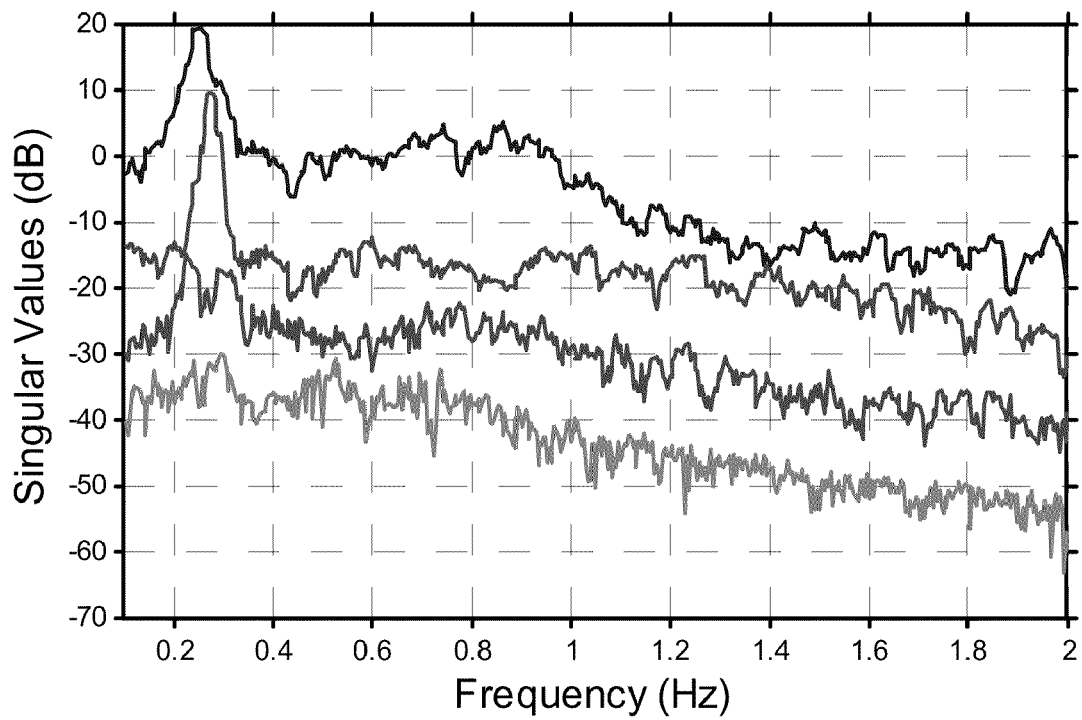
FIG. 10 is a singular value versus frequency diagram in accordance with an embodiment of the invention.
Figure 11:
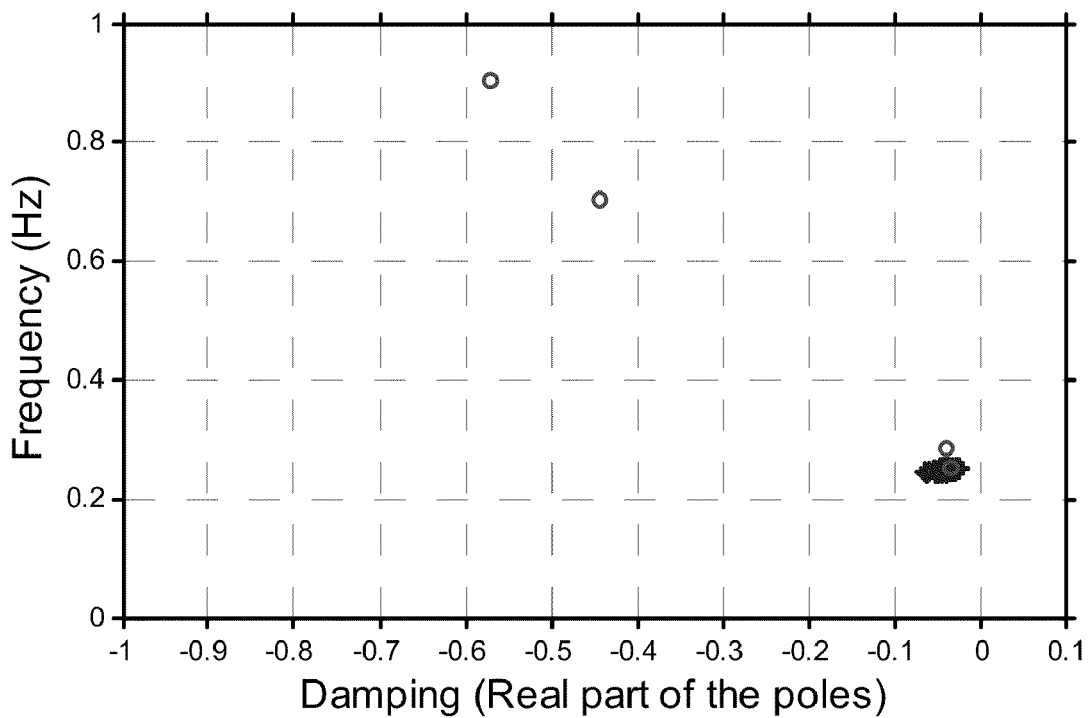
FIG. 11 is a frequency versus damping level diagram in accordance with an embodiment of the invention.

As explained in the theoretical part, each singular value corresponds to a single mode and its left singular vector corresponds to the mode shape when the modes are orthogonal. In the following example, the performance of the FDD technique in accordance with several embodiments of the method 200 is shown in the case of close modes. The system is similar to the foregoing poorly damped system, but the 0.4-Hz mode is replaced by a mode at 0.28 Hz with a 0.02 damping ratio. Now the system has two close poorly damped modes at 0.25 and 0.28 Hz, respectively. When the system is excited by white noise and 3-minutes of data with 10 dB noise is analyzed by FDD, the CMIF plot clearly shows a separation of two modes as shown in FIG. 10. The test was repeated 100 times and the strongest mode is identified quite accurately as shown in FIG. 11. The ability of FDD to identify close modes is another advantage as compared to other time domain methods.

5) Guard Against Underestimates

In several embodiments, the Fourier transform pair in equation (12) can be only a truncated version when MAC value is used to separate individual modes. The singular values, whose corresponding left singular vector has a low MAC value, with the peak have been discarded, and this leads to a tapering of the frequency domain by a rectangular window. Multiplication of the rectangular window in the frequency domain leads to a convolution in the time domain; thus, the inverse FFT of the truncated singular values no longer takes exactly the form in equation (13). An example below is used to clarify this point.

Figure 12:
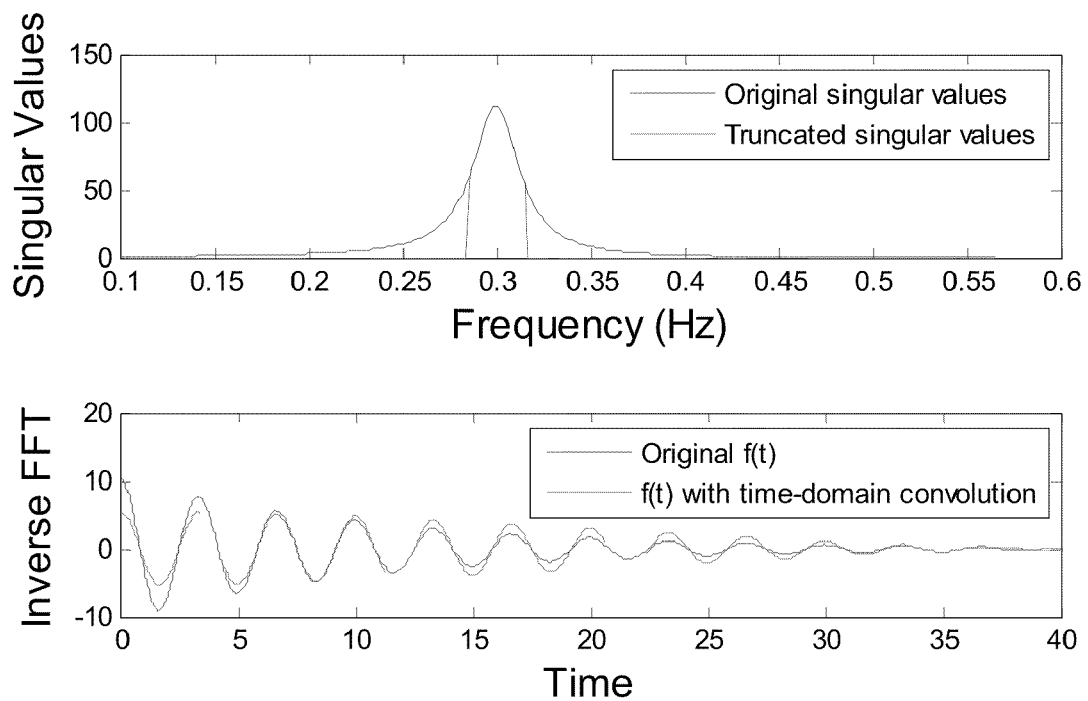
FIG. 12 is a decomposed mode diagram in accordance with an embodiment of the invention.
Figure 13:
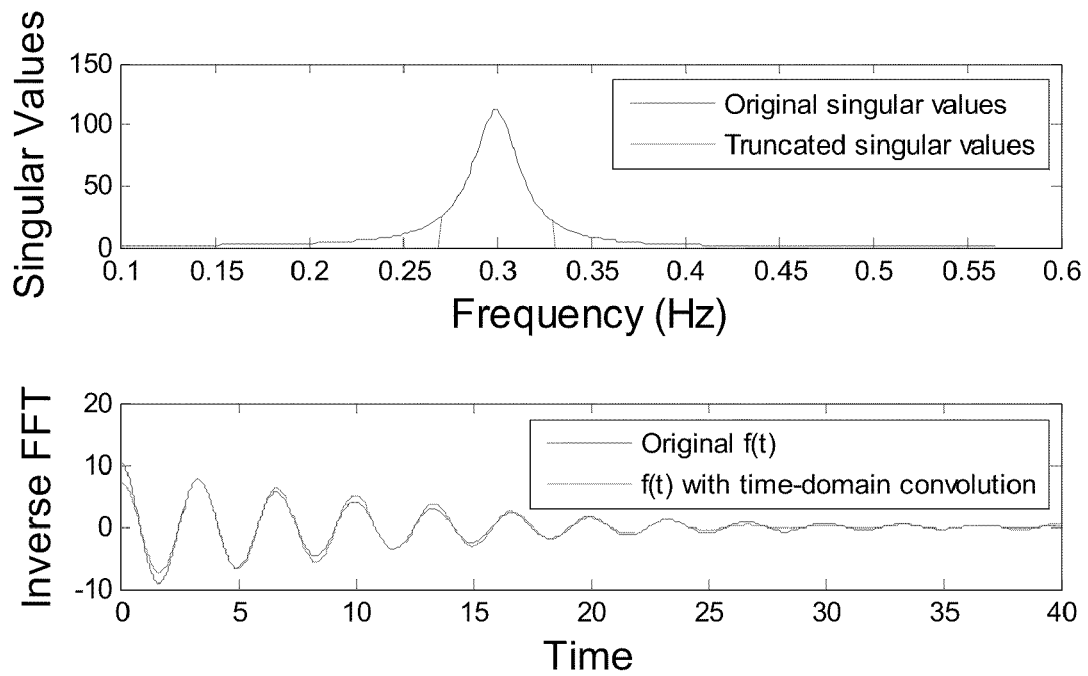
FIG. 13 is a decomposed mode diagram in accordance with another embodiment of the invention.

In the following example, a system with a single known mode at 0.3 Hz and 0.05 damping ratio was tested. In the first case, those singular values less than one half of the peak value are discarded, and the truncated singular values taken back to the time domain by inverse FFT. As shown in FIG. 12, the convolution in the time domain leads to an underestimation of the damping ratio. However, if the singular values less than ⅕ of the peak value are discarded, the convolution in time domain has lesser effect and the two curves are almost indistinguishable as shown in FIG. 13. In the implementation of FDD, the level for discarding singular values may be determined by MAC value. In several embodiments, a warning value, e.g. ⅕, may be set if many singular values larger than ⅕ of the peak value are discarded, the resulting damping ratio from FDD may be underestimated.

Case study 1—Aug. 10, 1996

Figure 14:
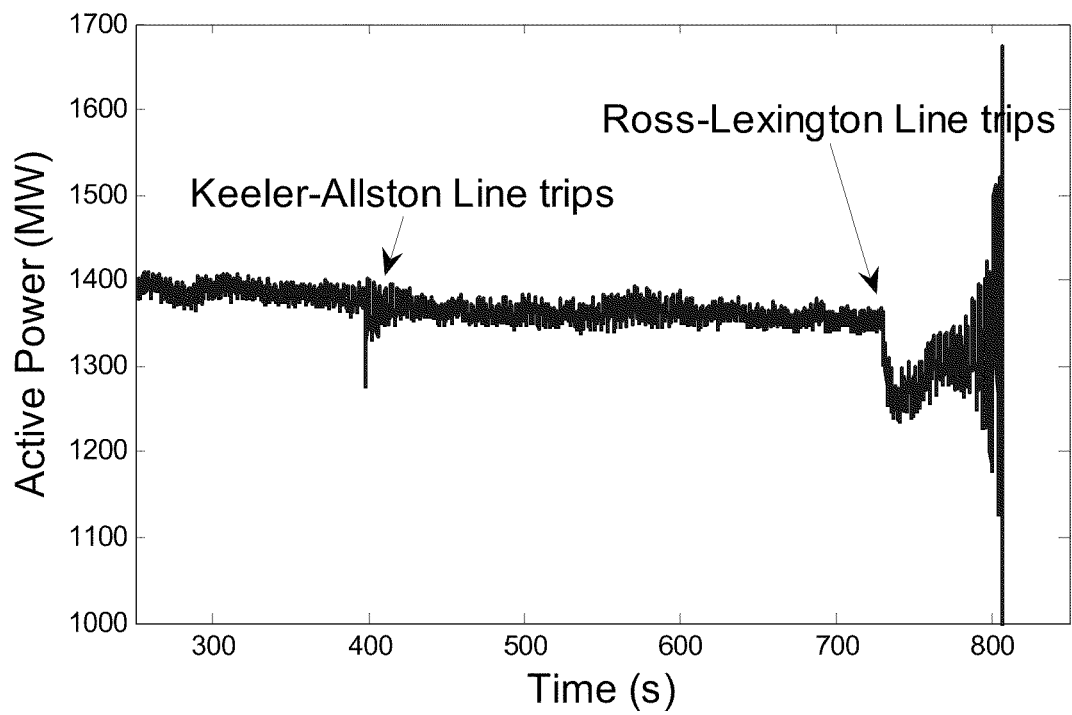
FIG. 14 is an active power versus time diagram in accordance with an embodiment of the invention.
Figure 15:
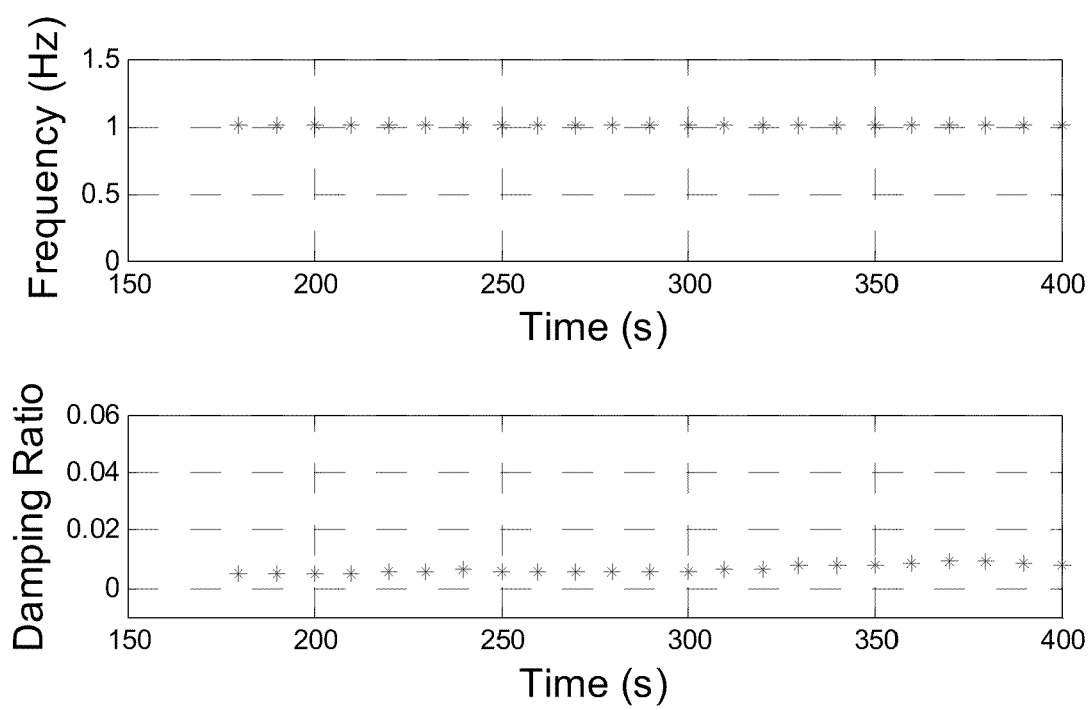
FIG. 15 is a damping ratio diagram in accordance with an embodiment of the invention.

On Aug. 10, 1996, a major blackout occurred in WECC system. At that time, a large amount of power was transmitted from the north to the south. After two major line-trippings, the system experienced a growing oscillation. This growing oscillation triggered complicated relay actions in the system and finally led to a system wide-blackout. The active power in one of the major tie-lines, from Malin to Round Mountain Line #1, is shown in FIG. 14 to conduct a brief review of the event. As shown in FIG. 14, after the Keeler-Allston line tripped, the system experienced a ringdown. Prony analysis of this signal from 400s to 420s shows a mode at 0.26 Hz with about +2.5% damping ratio.

First, we apply FDD to the data segment before the Keller-Allston line tripped. A total of 12 signals are analyzed simultaneously, including line active powers in Malin-Round Mountain #1, BCH-Custer and LADWP-Celilo, generations in McNary, Chief Joe, Grand Coulee, etc. The sampling frequency is 20 Hz, and a total of 3 minutes data are used for each FDD analysis. A moving window analysis procedure is used every 10 seconds. The result in FIG. 15 corresponds to the highest peak in the CMIF plot, and this most dominant mode has a mean frequency of 1.0080 Hz and a mean damping ratio of 0.0067 from moving window analysis. To identify the source of this mode, we check the auto-PSD of each signal and find that the 1 Hz mode only appears in the auto-PSD of the McNary generation, indicating that this mode is a local mode involving generators at McNary only. However, this mode did not become critical in the following events.

Figure 16:
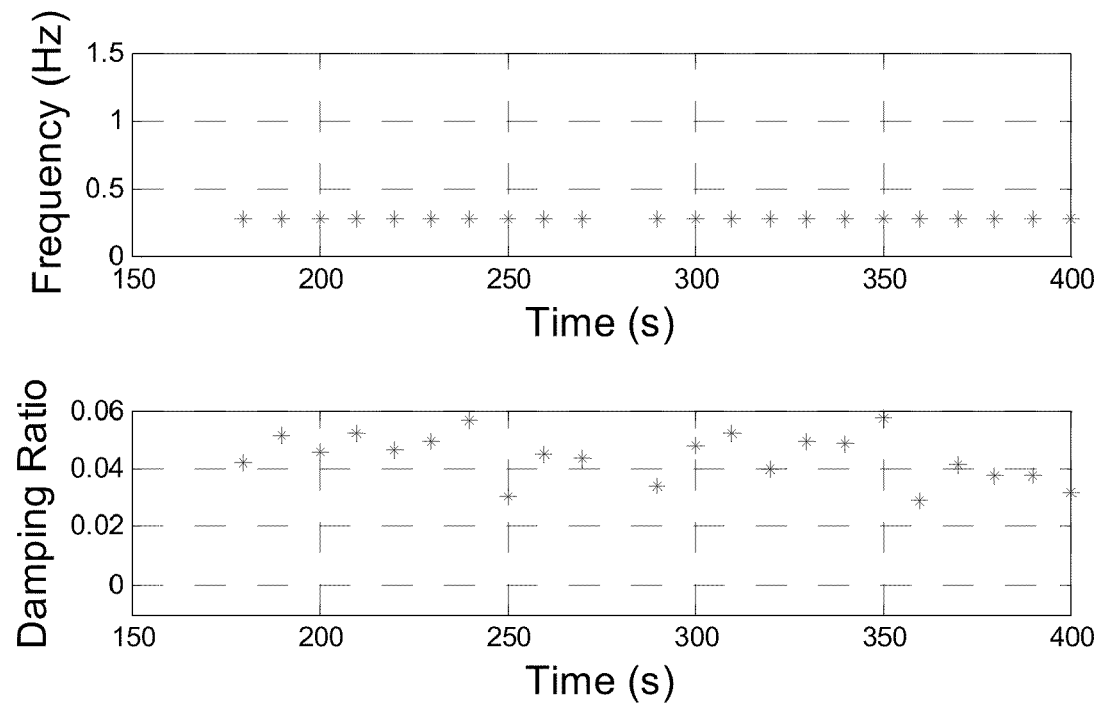
FIG. 16 is a damping ratio diagram in accordance with an embodiment of the invention.

The mode that corresponds to the second highest peak in CMIF plot is shown in FIG. 16. The moving window analysis shows the mean frequency at 0.2708 Hz with a 0.0441 damping ratio. The result shows that the 0.27 Hz inter-area mode is moderately damped before the first line tripping. If we take out the measurement of the McNary generation from the signal group and reapply FDD, the 0.27 Hz mode will become the highest peak in the CMIF plot, followed by the second highest peak at 0.43 Hz. This result shows the ability of FDD to identify the most excited poorly damped mode in the current system condition. The above test also validates our signal grouping strategy, i.e., if the signals are grouped in a hierarchical way, the poorly damped local mode can be identified geographically too.

Figure 17:
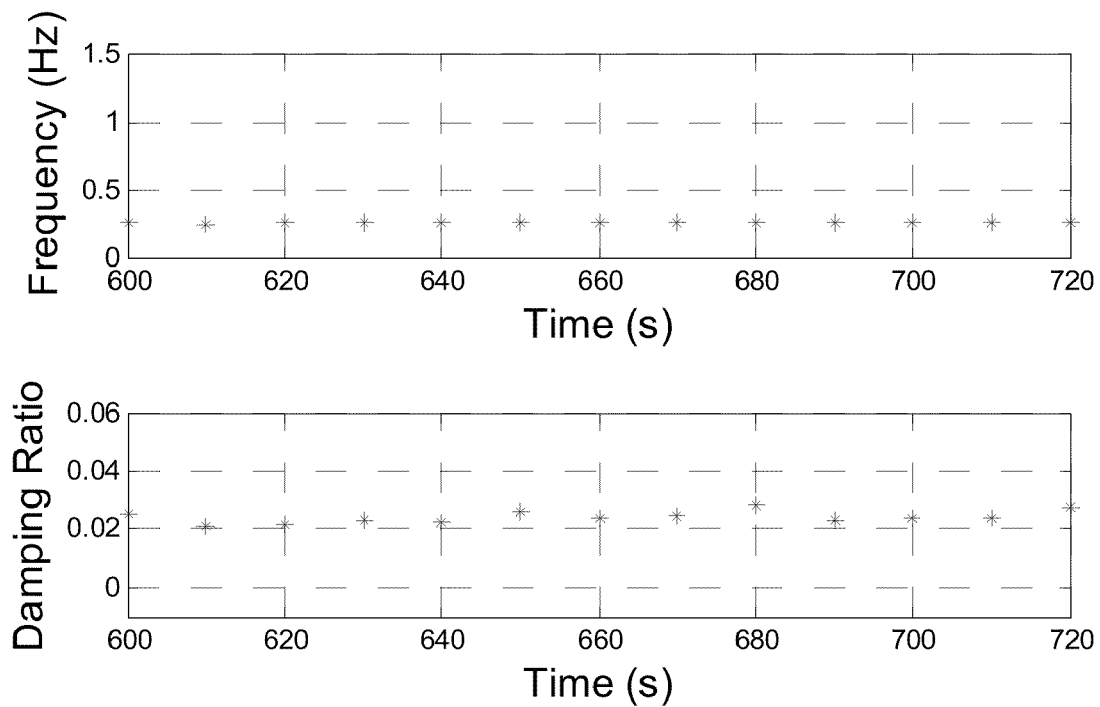
FIG. 17 is a damping ratio diagram in accordance with an embodiment of the invention.
Figure 18:
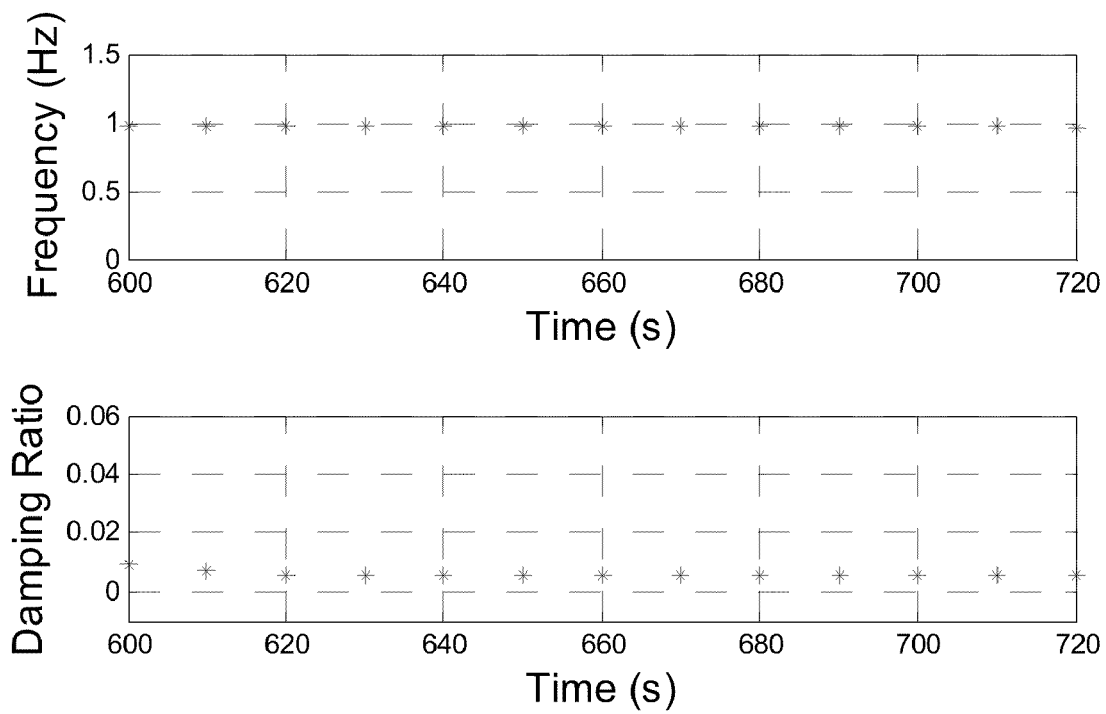
FIG. 18 is a damping ratio diagram in accordance with an embodiment of the invention.

Next, we apply the moving-window FDD to the ambient data after the Keel-Allston line tripped and before the tripping of Ross-Lexington line. The result in FIG. 17 shows that the most dominant mode has a mean frequency at 0.2509 Hz and a damping ratio at 0.0243 or +2.43%, which matches well with the result from Prony analysis of the post-disturbance data for the first tripping. The result for the second highest peak is shown in FIG. 18. Note that the most dominant mode before the Keller-Allston line tripped is at 1 Hz, but it changed to 0.25 Hz after the line tripped. After the first line tripped, the mode at 1 Hz is still poorly damped but it did not become critical, and the 0.25 Hz mode is poorly damped but still has positive damping ratio. This means that neither FDD nor any other ambient-type method can predict the growing oscillation after the second line tripped. This is a good example for showing the limitations of ambient type methods. All the ambient-type methods provide information for the current system state only, but are not able to handle unexpected changes to system conditions; thus, the post-disturbance and ambient methods need to work in a complementary manner for oscillation monitoring.

Case Study 2—Sept. 18, 2006 case

Figure 19:
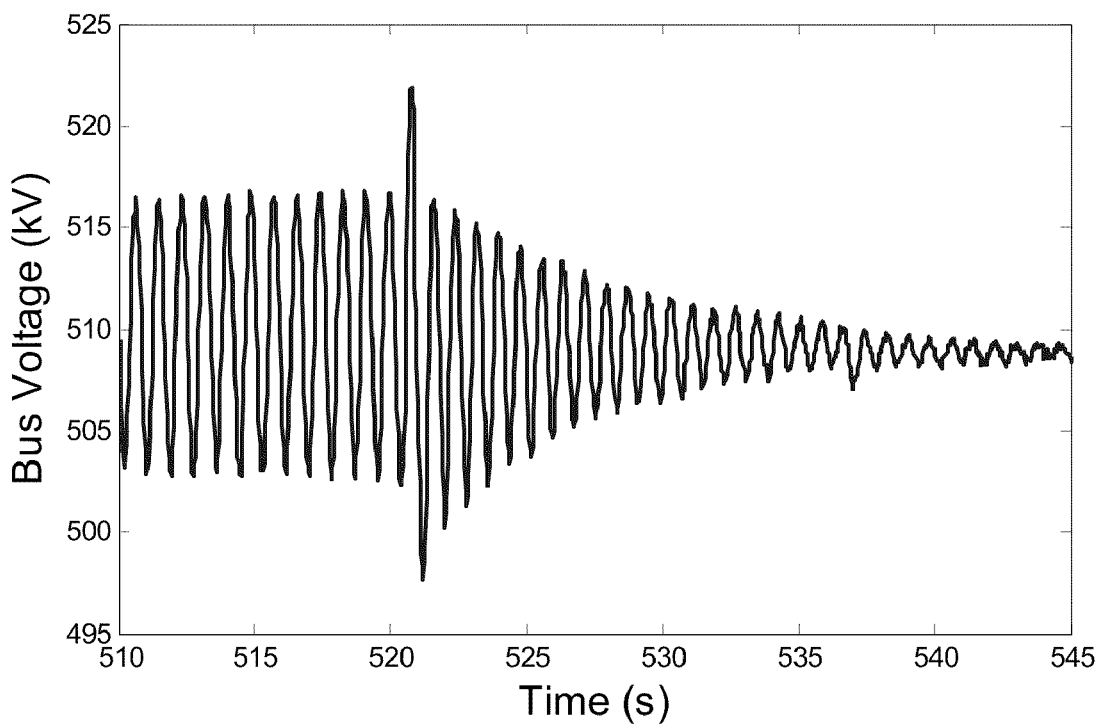
FIG. 19 is a bus voltage versus time diagram in accordance with an embodiment of the invention.

The second case is recorded in the TVA system on Sept. 18, 2006. After a 500 kV line tripping, we can see an oscillation in the system, especially in the PMU located at the Cumberland substation. After the line reclosing, the oscillation slowly damped out. The voltage magnitude at one 500 kV bus at Cumberland is shown in FIG. 19. The Prony analysis is applied to the data segment from 525s to 535s, and the result shows a 1.26 Hz mode with 0.017 damping ratio.

Figure 20:
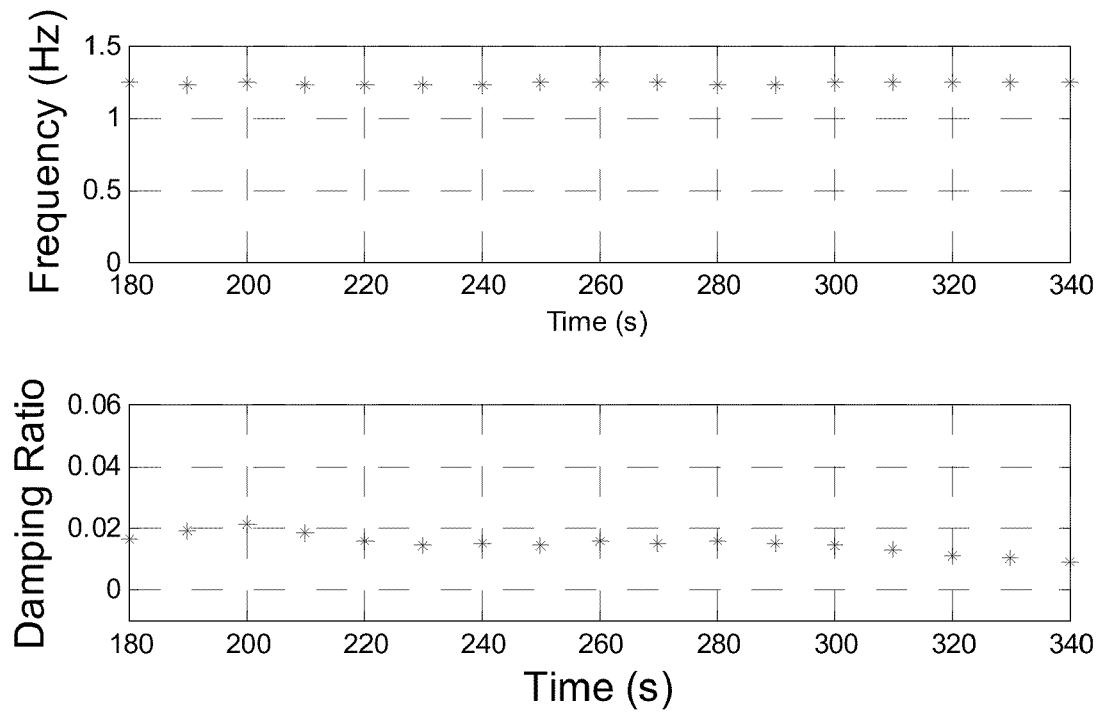
FIG. 20 is a damping ratio diagram in accordance with an embodiment of the invention.
Figure 21:
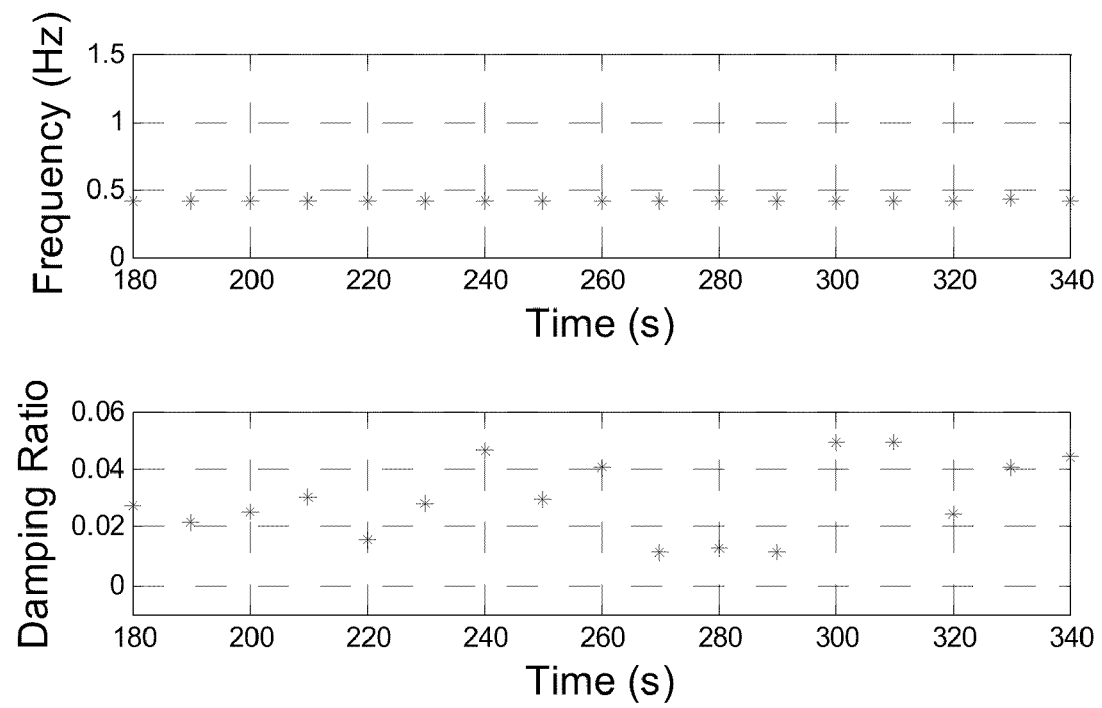
FIG. 21 is a damping ratio diagram in accordance with an embodiment of the invention.

The system condition before the 500 kV line tripping and after the line reclosing can be considered the same; thus, the result from FDD using ambient data should match the results of the Prony analysis. We apply FDD to the signals from the Cumberland PMU, including the bus voltages and currents. The sampling frequency is 30 Hz, and a total of 3 minutes of data are used for each FDD analysis. A 10-second moving window analysis is performed and the results for the most dominant mode are shown in FIG. 20. The mean frequency is 1.2363 Hz and the mean damping ratio is 0.0149, which matches reasonably well with the Prony analysis result. If the system operator had taken some preventive control, the system may have avoided the sustained oscillation. The second highest peak is shown in FIG. 21, and this mode has a mean frequency of 0.4177 Hz with a 0.0301 damping ratio from moving window analysis, which also needs attention of the system operators.

We claim:

1. A method for monitoring electromechanical oscillation in a power system, comprising:
   collecting a plurality of phasor measurements with corresponding phasor measurement units operatively coupled to a power system having a power source, a power consuming load, and a power grid at a plurality of locations in the power system;
   in a processor, forming a power density spectrum in frequency domain based on the phasor measurements collected from the plurality of locations in the power system;
   identifying an oscillation in the power density spectrum, the oscillation having a power density larger than other oscillations;
   analyzing the identified oscillation in time domain to determine a damping characteristic of the identified oscillation; and
   indicating that an insufficiently damped oscillation exists in the power system if the determined damping characteristic of the oscillation meets a predetermined condition.

2. The method of claim 1 wherein
   forming the power density spectrum includes forming a power density spectrum matrix by estimating an auto and cross power density spectrum;
   identifying the oscillation includes:
      applying singular value decomposition to the power density spectrum matrix at individual frequencies to determine singular values corresponding to the individual frequencies;
      plotting the determined singular values versus the individual frequencies; and
      determining a frequency corresponding to the oscillation, the frequency having a singular value larger than the other frequencies;
   analyzing the identified oscillation in the time domain includes:
      applying Prony analysis to the identified oscillation in the time domain to determine a damping ratio for the identified oscillation;
   indicating that the insufficiently damped oscillation exists includes indicating that the insufficiently damped oscillation exists in the power system if the determined damping ratio is below a threshold; and
   wherein the method further includes identifying at least one of the locations in the power system that is contributing to the identified frequency of the oscillation.

3. The method of claim 1, further comprising identifying at least one source in the power system that corresponds to the identified oscillation.

4. The method of claim 1 wherein forming the power density spectrum in a frequency domain includes applying fast Fourier transformation to the phasor measurements collected from the plurality of locations in the power system.

5. The method of claim 1 wherein forming the power density spectrum in a frequency domain includes applying fast Fourier transformation to the phasor measurements collected from the plurality of locations in the power system, and wherein the method further includes applying reverse fast Fourier transformation to the identified oscillation in the power density spectrum to obtain the identified oscillation in the time domain.

6. The method of claim 1 wherein forming the power density spectrum in a frequency domain includes applying fast Fourier transformation to the phasor measurements collected from the plurality of locations in the power system, and wherein the method further includes:
   isolating the power density spectrum based on the identified oscillation; and
   applying reverse fast Fourier transformation to the isolated power density spectrum to obtain the identified oscillation in the time domain.

7. The method of claim 1 wherein forming the power density spectrum in a frequency domain includes applying fast Fourier transformation to the phasor measurements collected from the plurality of locations in the power system, and wherein the method further includes:
   searching nearby oscillations to calculate a modal assurance criterion value;
   isolating the power density spectrum based on the identified oscillation and the calculated modal assurance criterion value; and
   applying reverse fast Fourier transformation to the isolated power density spectrum to obtain the identified oscillation in the time domain.

8. The method of claim 1 wherein forming the power density spectrum in a frequency domain includes applying fast Fourier transformation to the phasor measurements collected from the plurality of locations in the power system, and wherein the method further includes:
   searching nearby oscillations to calculate a modal assurance criterion value;
   isolating the power density spectrum based on the identified oscillation and the calculated modal assurance criterion value;
   applying reverse fast Fourier transformation to the isolated power density spectrum to obtain the identified oscillation in the time domain;
   determining a truncation level of the isolated power density spectrum; and
   setting an alarm if the determined truncation level exceeds a predetermined threshold.

9. A method for monitoring electromechanical oscillation in a power system, comprising:
   collecting a plurality of phasor measurements with corresponding phasor measurement units operatively coupled to a power system having a power source, a power consuming load, and a power grid at a plurality of locations in the power system;
   retrieving the plurality of phasor measurements collected from the plurality of locations in the power system;
   in a processor, determining whether a system disturbance is detected;
   if a system disturbance is detected, applying post-disturbance analysis to the retrieved phasor measurements;
   if a system disturbance is not detected, applying ambient data analysis to the retrieved phasor measurements; and
   determining whether an insufficiently damped oscillation exists based on at least one of the post-disturbance analysis and the ambient data analysis.

10. The method of claim 9 wherein:
    applying the ambient data analysis includes, if a system disturbance is not detected, applying the ambient data analysis to first phasor measurements collected in a first time period to determine an insufficiently damped oscillation;
    applying post-disturbance analysis includes, if a system disturbance is detected after the first time period, applying post-disturbance analysis to second phasor measurements collected during a second time period after the first time period; and
    comparing results of the ambient data analysis and the post-disturbance analysis to confirm the determined insufficiently damped oscillation using the ambient data analysis.

11. The method of claim 9 wherein applying ambient data analysis includes:
    forming a power density spectrum in frequency domain based on the retrieved phasor measurements of the power system;
    identifying an oscillation in the power density spectrum, the oscillation having a power density larger than other oscillations;
    analyzing the identified oscillation in time domain to determine a damping characteristic of the identified oscillation; and
    determining whether the damping characteristic of the oscillation meets a predetermined condition.

12. The method of claim 9 wherein applying post-disturbance analysis includes applying Prony analysis to the retrieved phasor measurements.

13. A power system, comprising:
    a power source;
    a power consuming load;
    a power grid operatively coupling the power source to the power consuming load;
    a plurality of phasor measurement units operatively coupled to the power source, the power consuming load, and/or the power grid, the phasor measurement units being configured to collect a plurality of phasor measurements from the power source, the power consuming load, and/or the power grid; and
    a processor operatively coupled to the plurality of phasor measurement units, the processor having a non-transitory computer readable medium containing codes for performing a method comprising:
      analyzing the phasor measurements collected by the phasor measurement units in a frequency domain to identify a frequency having a power density larger than other frequencies;
      analyzing an oscillation corresponding to the identified frequency in a time domain to determine a damping characteristic of the analyzed oscillation; and
      indicating that an insufficiently damped oscillation exists in the power system based on the determined damping characteristic of the oscillation.

14. The power system of claim 13 wherein
    analyzing the phasor measurements includes forming a power density spectrum matrix by estimating an auto and cross power density spectrum based on the phasor measurements;

analyzing the oscillation includes:
  applying singular value decomposition to the power density spectrum matrix at individual frequencies to determine singular values corresponding to the individual frequencies;
  plotting the determined singular values versus the individual frequencies;
  determining a frequency corresponding to the oscillation, the frequency having a singular value larger than other frequencies; and
  identifying at least one of the locations in the power system that contributes to the identified frequency of the oscillation;
analyzing the oscillation corresponding to the identified frequency in the time domain includes:
  applying Prony analysis to the identified oscillation in the time domain to determine a damping ratio for the identified oscillation; and
  indicating that the insufficiently damped oscillation exists includes indicating the insufficiently damped oscillation exists in the power system if the determined damping ratio is below a threshold.

15. The power system of claim 13 wherein analyzing the oscillation includes applying fast Fourier transformation to the phasor measurements collected by the phasor measurement units, and wherein the method further includes:
  searching nearby oscillations to calculate a modal assurance criterion value;
  isolating the power density spectrum based on the identified oscillation and the calculated modal assurance criterion value; and
  applying reverse fast Fourier transformation to the isolated power density spectrum to obtain the identified oscillation in the time domain.

16. The power system of claim 13 wherein analyzing the oscillation includes applying fast Fourier transformation to the phasor measurements collected by the phasor measurement units, and wherein the method further includes:
  searching nearby oscillations to calculate a modal assurance criterion value;
  isolating the power density spectrum based on the identified oscillation and the calculated modal assurance criterion value;
  applying reverse fast Fourier transformation to the isolated power density spectrum to obtain the identified oscillation in the time domain;
  determining a truncation level of the isolated power density spectrum; and
  setting an alarm if the determined truncation level exceeds a predetermined threshold.

17. The power system of claim 13 wherein analyzing the oscillation corresponding to the identified frequency in a time domain includes analyzing an electromechanical oscillation corresponding to the identified frequency in a time domain.

18. A computer system for monitoring electromechanical oscillation in a power system, comprising:
  a processor; and
  a non-transitory computer readable medium operatively coupled to the processor, the computer readable medium containing codes for performing a method comprising:
    analyzing phasor measurements in frequency domain to identify a frequency having a power density larger than other frequencies, the phasor measurements being collected from a plurality of locations in the power system;
    analyzing an oscillation corresponding to the identified frequency in a time domain to determine a damping characteristic of the analyzed oscillation; and
    indicating that an insufficiently damped oscillation exists in the power system based on the determined damping characteristic of the oscillation.

19. The computer system of claim 18, further comprising aligning the phasor measurements based on a common reference of time, and wherein analyzing the phasor measurements includes analyzing the aligned phasor measurements in parallel groups.

20. The computer system of claim 18 wherein the method further comprises identifying at least one source in the power system that contributes to the identified oscillation.

21. The computer system of claim 18 wherein analyzing the oscillation includes applying fast Fourier transformation to the phasor measurements collected by the phasor measurement units, and wherein the method further includes applying reverse fast Fourier transformation to the identified oscillation in a power density spectrum to obtain the identified oscillation in the time domain.

22. The computer system of claim 18 wherein analyzing the oscillation corresponding to the identified frequency in a time domain includes analyzing an electromechanical oscillation corresponding to the identified frequency in a time domain.

* * * * *